US012651641B2

(12) United States Patent
Kwon et al.

(10) Patent No.: US 12,651,641 B2
(45) Date of Patent: Jun. 9, 2026

(54) MEMORY DEVICE AND REPAIR METHOD OF THE MEMORY DEVICE

(71) Applicant: SAMSUNG ELECTRONICS CO., LTD., Suwon-si (KR)

(72) Inventors: Taehong Kwon, Suwon-si (KR); Daeseok Byeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 116 days.

(21) Appl. No.: 18/425,747

(22) Filed: Jan. 29, 2024

(65) Prior Publication Data

US 2024/0257898 A1      Aug. 1, 2024

(30) Foreign Application Priority Data

Jan. 30, 2023      (KR) ........................ 10-2023-0011948

(51) Int. Cl.
G11C 29/00          (2006.01)
(52) U.S. Cl.
CPC .......... G11C 29/702 (2013.01); G11C 29/781 (2013.01); G11C 29/789 (2013.01)
(58) Field of Classification Search
CPC .... G11C 29/702; G11C 29/781; G11C 29/789
See application file for complete search history.

(56) References Cited

U.S. PATENT DOCUMENTS 7,215,592 B2      5/2007   Cho et al.
8,031,544 B2      10/2011  Kim et al.

8,427,872 B2      4/2013   Kim
9,190,176 B2      11/2015  Kim
9,472,297 B2      10/2016  Lim
10,726,891 B1     7/2020   Prakash et al.
(Continued)

FOREIGN PATENT DOCUMENTS

EP      3 975 187 A1      3/2022
KR      10-0418521 B1    2/2004
(Continued)

OTHER PUBLICATIONS

Extended European Search Report dated May 13, 2024, issued by the European Patent Office in European Application No. 24154548.2.

(Continued)

*Primary Examiner* — Woo H Choi
(74) *Attorney, Agent, or Firm* — Sughrue Mion, PLLC

(57) ABSTRACT

A memory device is provided. The memory device includes: a first cell region provided in a first layer and including a first bit line and a first redundant bit line; a second cell region provided in a second layer and including a second bit line and a second redundant bit line; a peripheral region provided in a third layer and including first page buffers configured to be respectively connected to the first bit line and the second bit line, and a second page buffer configured to be commonly connected to the first redundant bit line and the second redundant bit line; and a control circuit configured to: based on the first bit line being defective, replace the first bit line with the first redundant bit line; and based on the second bit line being defective, replace the second bit line with the second redundant bit line.

8 Claims, 16 Drawing Sheets

(56)  References Cited

U.S. PATENT DOCUMENTS

| | | | |
|---|---|---|---|
| 10,879,260 | B2 | 12/2020 | Uryu et al. |
| 2002/0186590 | A1 | 12/2002 | Lee |
| 2010/0329053 | A1 | 12/2010 | Park et al. |
| 2012/0182816 | A1 | 7/2012 | Ide et al. |
| 2021/0312954 | A1 | 10/2021 | Smith |
| 2022/0100622 | A1* | 3/2022 | Park ..................... G11C 29/81 |
| 2022/0139895 | A1 | 5/2022 | Choi et al. |
| 2023/0022531 | A1 | 1/2023 | Hsu |

FOREIGN PATENT DOCUMENTS

| | | |
|---|---|---|
| KR | 10-2012-0005906 A | 1/2012 |
| KR | 10-2014-0070304 A | 6/2014 |
| WO | 2021/007169 A1 | 1/2021 |

OTHER PUBLICATIONS

Kyouogku et al., "3-Dimensional Memory Module Assembly Technology", IEMT/IMC Symposium, 2nd 1998, IEEE, Apr. 15, 1998, pp. 272-277 (6 pages total).

Chen et al., "SoIC for Low-Temperature, Multi-Layer 3D Memory Integration", 2020 IEEE 70th Electronic Components and Technology Conference (ECTC), IEEE, Jun. 3, 2020, pp. 855-860 (6 pages total).

* cited by examiner

MEMORY DEVICE AND REPAIR METHOD OF THE MEMORY DEVICE

CROSS-REFERENCE TO RELATED APPLICATION

This application claims priority to Korean Patent Application No. 10-2023-0011948, filed on Jan. 30, 2023, in the Korean Intellectual Property Office, the disclosure of which is incorporated by reference herein in its entirety.

BACKGROUND

The present disclosure relates to a memory device and a repair method of the memory device, and more particularly, to a memory device, which includes a plurality of layers and performs a repair operation on a defective bit line or word line, and a repair method of the memory device.

Three-dimensional (3D) memory devices are being developed. As the number of layers stacked in a 3D memory cell array increases, a lower gate layer may become thinner. In addition, as an insulating layer separating bit lines or word lines from each other becomes thinner, the insulating layer is more likely to break down. Such break down may result in defects, such as an "open" or a "short," between bit lines or word lines.

A repair operation may be performed on defective bit lines or word lines. However, according to related repair methods, defective bit lines or word lines are replaced with redundant bit lines or redundant word lines.

However, these repair methods are limited due to the space required for redundant bit lines.

SUMMARY

One or more example embodiments provide a memory device in which space used for redundant bit lines is reduced by providing redundant bit lines that share one page buffer.

One or more example embodiments provide a memory device in which space used for redundant word lines is reduced by providing redundant word lines that share one decoder unit (i.e., decoder circuit).

According to an aspect of an example embodiment, a memory device includes: a first cell region provided in a first layer among a plurality of layers of the memory device, the first cell region including a first bit line and a first redundant bit line; a second cell region provided in a second layer among the plurality of layers, the second cell region including a second bit line and a second redundant bit line; a peripheral region provided in a third layer among the plurality of layers, the peripheral region including a plurality of first page buffers configured to be respectively connected to the first bit line and the second bit line, and a second page buffer configured to be commonly connected to the first redundant bit line and the second redundant bit line; and a control circuit configured to: based on the first bit line being identified as defective, replace the first bit line with the first redundant bit line; and based on the second bit line being identified as defective, replace the second bit line with the second redundant bit line.

According to another aspect of an example embodiment, a memory device includes: a first cell region provided in a first layer among a plurality of layers of the memory device, the first cell region including a first word line and a first redundant word line; a second cell region provided in a second layer among the plurality of layers, the second cell region including a second word line and a second redundant word line; a peripheral region provided in a third layer among the plurality of layers, the peripheral region including a plurality of first decoder circuits respectively connected to the first word line and the second word line, and a second decoder circuit commonly connected to the first redundant word line and the second redundant word line; and a control circuit configured to: based on the first word line being identified as defective, replace the first word line with the first redundant word line; and based on the second word line being identified as defective, replace the second word line with the second redundant word line.

According to another aspect of an example embodiment, a repair method of a memory device including a plurality of layers and a plurality of cell regions, includes: identifying whether a first bit line present in a first cell region or a second bit line present in a second cell region provided in a layer different from a layer of the first cell region is defective; and repairing the first bit line or the second bit line with a first redundant bit line or a second redundant bit line. The repairing includes: replacing the first bit line with the first redundant bit line based on the first bit line being identified as defective; and replacing the second bit line with the second redundant bit line based on the second bit line being identified as defective.

BRIEF DESCRIPTION OF DRAWINGS

The above and other objects and features will be more apparent from the following description of example embodiments, taken in conjunction with the accompanying drawings in which:

FIG. 3 is a block diagram illustrating a memory device from a word line point of view, according to an example embodiment;

FIG. 6 is a diagram for describing a case where a short occurs in a bit line in a memory device, according to an example embodiment;

DETAILED DESCRIPTION

Example embodiments will be described more fully hereinafter with reference to the accompanying drawings, in which some example embodiments are shown. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1:
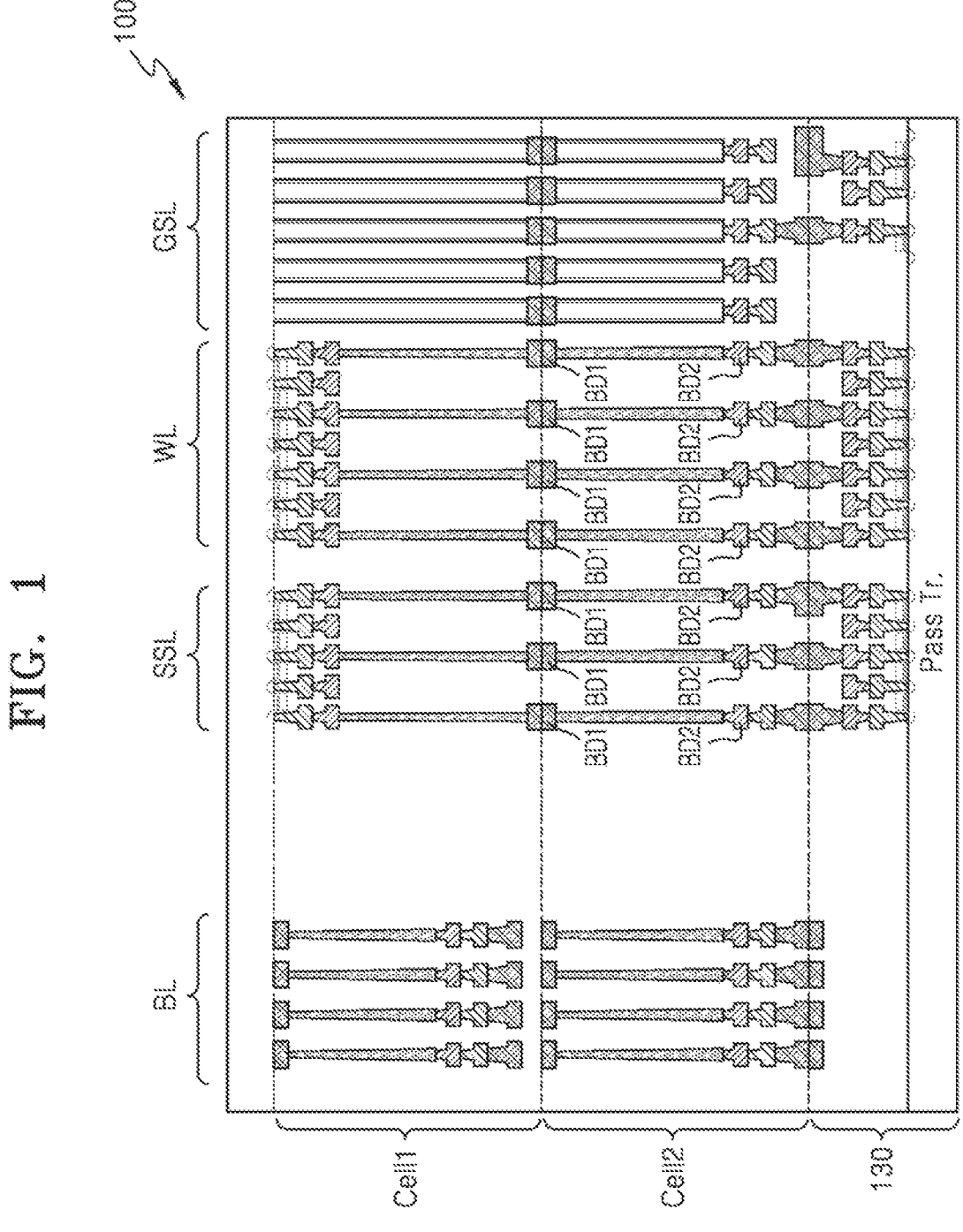
FIG. 1 is a diagram illustrating a memory device according to an example embodiment.

FIG. 1 is a diagram illustrating a memory device 100 according to an example embodiment.

Referring to FIG. 1, the memory device 100 according to an example embodiment may include a plurality of layers and include a plurality of cell regions.

The memory device 100 according to an example embodiment may include a plurality of layers. For example, the memory device 100 may include first to third layers and may include a first cell region Cell1, a second cell region Cell2, or a peripheral region 130.

The first cell region Cell1 according to an example embodiment may be disposed in the first layer among the layers of the memory device 100 and may include a first bit line and a first redundant bit line. The first bit line according to an example embodiment may refer to a bit line disposed in the first cell region Cell1. The first redundant bit line according to an example embodiment may be a bit line that is present in the first cell region Cell1 and replaces the first bit line when the first bit line is defective.

The second cell region Cell2 according to an example embodiment may be disposed in the second layer among the layers of the memory device 100 and may include a second bit line and a second redundant bit line. The second bit line according to an example embodiment may refer to a bit line disposed in the second cell region Cell2. The second redundant bit line according to an example embodiment may be a bit line that is present in the second cell region Cell2 and replaces the second bit line when the second bit line is defective. For example, the first and second cell regions Cell1 and Cell2 may each include a plurality of bit lines and may each include redundant bit lines with which a repair operation is performed on defective bit lines.

The memory device 100 according to an example embodiment may include a plurality of stacks, and the stacks of the memory device 100 may constitute respective layers. The stacks according to an example embodiment may be present in the first cell region Cell1 or the second cell region Cell2. The first cell region Cell1 and the second cell region Cell2 according to an example embodiment may be connected to each other by first bonding pads BD1. For example, string select lines SSL, word lines WL, or ground select lines GSL of the first cell region Cell1 may be respectively connected to string select lines SSL, word lines WL, or ground select lines GSL of the second cell region Cell2 by the first bonding pads BD1.

The peripheral region 130 according to an example embodiment may be disposed in the third layer among the layers of the memory device 100, and may include a plurality of first page buffers configured to be respectively connected to the first bit line and the second bit line, and a second page buffer configured to be commonly connected to the first redundant bit line and the second redundant bit line. For example, the first bit line and the second bit line may be respectively connected to the first page buffers through a first common line, and the first redundant bit line and the second redundant bit line may share the second page buffer through a second common line.

According to an example embodiment, when the first bit line is defective, the first bit line of the first cell region Cell1 may be replaced with the first redundant bit line. According to an example embodiment, when the second bit line is defective, the second bit line may be replaced with the second redundant bit line.

The peripheral region 130 according to an example embodiment may be connected to the second cell region Cell2 by the second bonding pads BD2, and may be configured to determine whether the first bit line or the second bit line is defective. In addition, the peripheral region 130 according to an example embodiment may be configured to repair the first bit line or the second bit line with the first redundant bit line or the second redundant bit line based on a result of determining whether the first bit line or the second bit line is defective. A process of performing a repair operation on bit lines or word lines in the memory device 100 is described in detail with reference to FIGS. 2 and 3.

The word lines WL according to an example embodiment may share a pass transistor that is present in the peripheral region 130. For example, in the memory device 100 including a plurality of stacked layers, the word lines WL may pass through the first cell region Cell1, the second cell region Cell2, and the peripheral region 130 and may be connected to the pass transistor that is present in the peripheral region 130. Accordingly, the word lines WL share the pass transistor.

Figure 2:
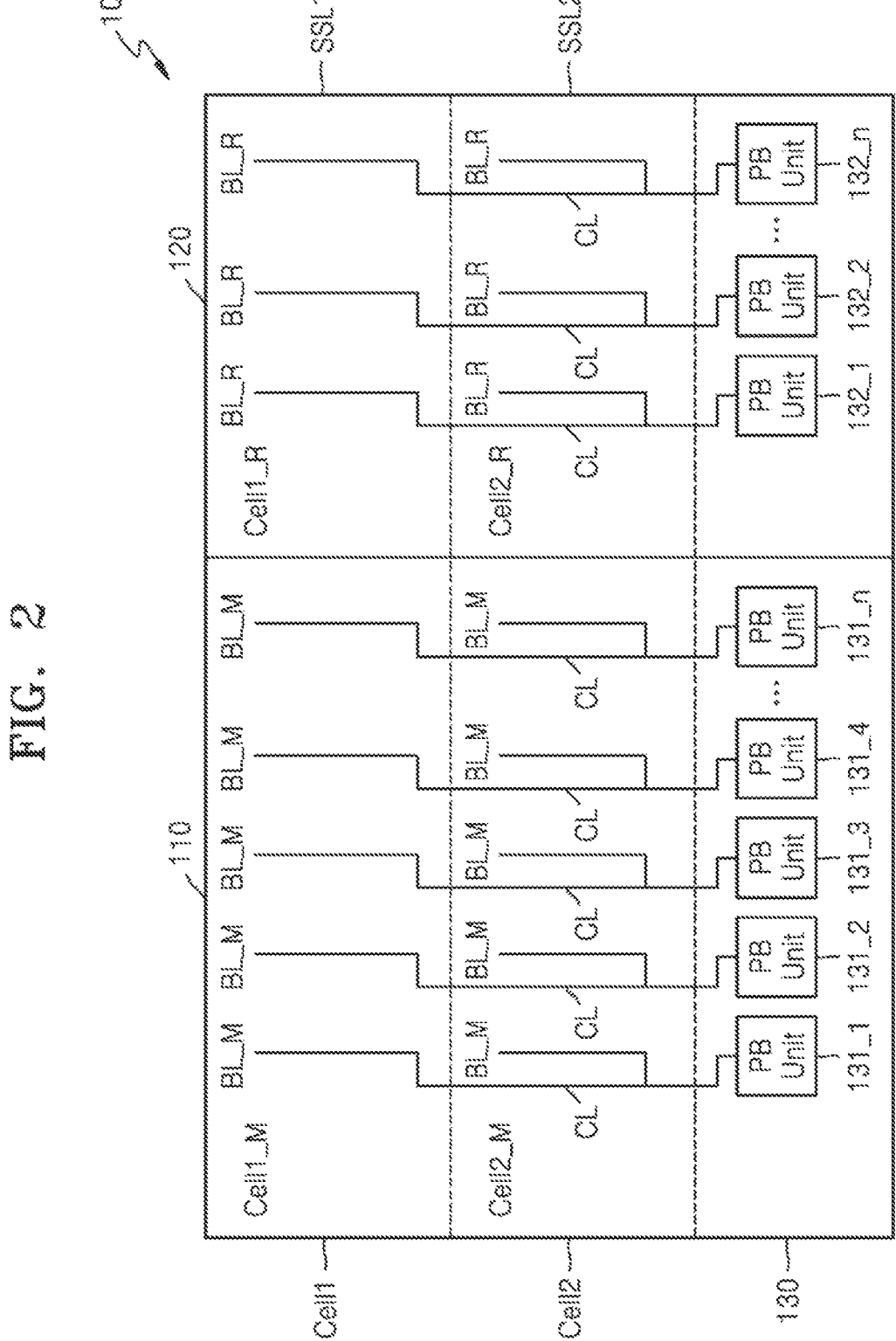
FIG. 2 is a block diagram illustrating a memory device from a bit line point of view, according to an example embodiment.

FIG. 2 is a block diagram illustrating a memory device 100 from a bit line point of view, according to an example embodiment.

Referring to FIG. 2, the memory device 100 according to an example embodiment may be divided into a main region 110 and a repair region 120 according to the type of bit line. The main region 110 according to an example embodiment may be an area in which normal bit lines BL_M are present. The repair region 120 according to an example embodiment may be an area in which redundant bit lines BL_R are present. The normal bit line BL_M according to an example embodiment may refer to a bit line other than the redundant bit line BL_R, and the redundant bit line BL_R may refer to a bit line that may be used to replace a defective normal bit line BL_M.

The memory device 100 according to an example embodiment may be divided into a first cell region Cell1 and a second cell region Cell2 according to a stack structure, and may include a peripheral region 130. The first cell region Cell1 according to an example embodiment may include a first main cell region Cell1_M and a first repair cell region Cell1_R. The first main cell region Cell1_M according to an example embodiment may include the normal bit lines BL_M. The first repair cell region Cell1_R according to an example embodiment may include the redundant bit lines BL_R.

The second cell region Cell2 according to an example embodiment may include a second main cell region Cell2_M or a second repair cell region Cell2_R. The second main cell region Cell2_M according to an example embodiment may include the normal bit lines BL_M. The second repair cell region Cell2_R according to an example embodiment may include the redundant bit lines BL_R. According to an example embodiment, the first cell region Cell1 may be connected to a first string select line SSL1, and the second cell region Cell2 may be connected to a second string select line SSL2.

According to an example embodiment, a first bit line may refer to the normal bit line included in the first cell region Cell1, and a second bit line may refer to the normal bit line included in the second cell region Cell2. According to an example embodiment, the first bit line and the second bit line may be connected to each other through a common line CL.

According to an example embodiment, the first bit line may be present in the first cell region Cell1, the second bit line may be present in the second cell region Cell2, and the first bit line and the second bit line may be connected to each other through the common line CL. The common lines CL may be connected to different page buffers (i.e., PB units), respectively. The main region 110 according to an example embodiment may include first page buffers 131_1, 131_2, 131_3, . . . , 131__n_. For example, the bit lines in the main region 110 may be present in the first cell region Cell1 and the second cell region Cell2, and may be connected to at least one of the first page buffers 131_1, 131_2, 131_3, . . . , and 131__n_ through the common line CL.

According to an example embodiment, the first redundant bit line may be present in the first cell region Cell1, the second redundant bit line may be present in the second cell region Cell2, and the first redundant bit line and the second redundant bit line may be connected to each other through the common line CL, as well as at least one of second page buffers 132_1, 132_2, . . . , and 132__n_. The repair region 120 according to an example embodiment may include second page buffers 132_1, 132_2, . . . , 132__n_. For example, the bit lines in the repair region 120 may be present in the first cell region Cell1 and the second cell region Cell2, and may be connected to at least one of the second page buffers 132_1, 132_2, . . . , and 132__n_ through the common line CL.

In FIG. 2, the first cell region Cell1 and the second cell region Cell2 may be distinguished from each other by addresses assigned thereto. For example, the first cell region Cell1 may be configured to have a first address, and the second cell region Cell2 may be configured to have a second address. The addresses according to an example embodiment may be values assigned at the time of manufacturing the first cell region Cell1 and the second cell region Cell2. The respective page buffers according to an example embodiment may be configured to detect a defective bit line based on the address of the cell region. For example, the first page buffers 131_1, 131_2, 131_3, 131_4, . . . , 131__n_ may each distinguish the first bit line from the second bit line by the first address or the second address.

The first cell region Cell1 according to an example embodiment may be connected to the first string select line SSL1. The second cell region Cell2 according to an example embodiment may be connected to the second string select line SSL2. Because the first cell region Cell1 and the second cell region Cell2 are connected to different string select lines, the memory device 100 according to an example embodiment may independently select the word lines.

Figure 3:
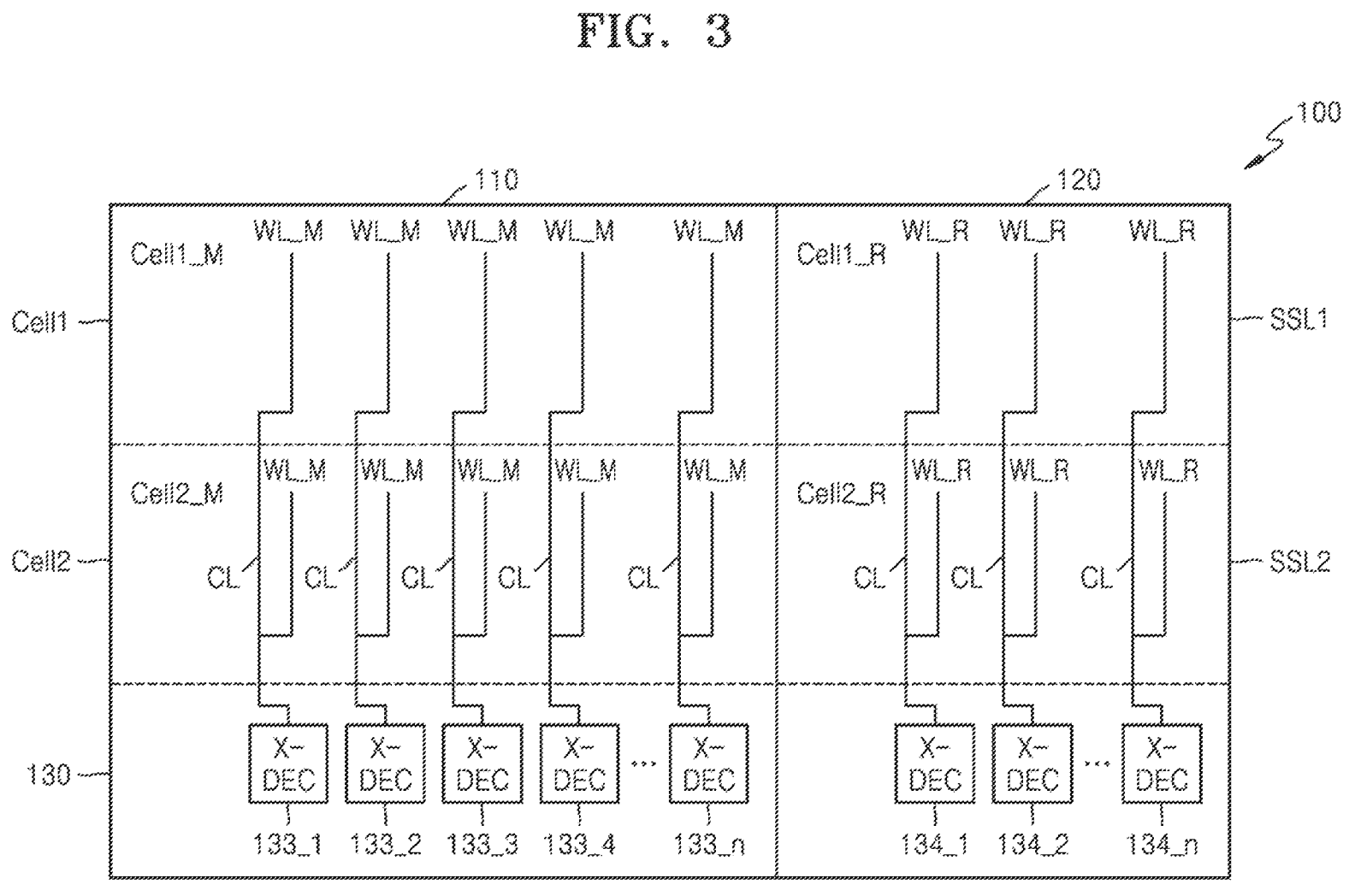

FIG. 3 is a block diagram illustrating a memory device from a word line point of view, according to an example embodiment.

Referring to FIG. 3, the memory device 100 according to an example embodiment may be divided into a main region 110 and a repair region 120 according to the type of bit line. The main region 110 according to an example embodiment may be an area in which normal word lines WL_M are present. The repair region 120 according to an example embodiment may be an area in which redundant word lines WL_R are present. The normal word line WL_M according to an example embodiment may refer to a word line other than the redundant word line WL_R, and the redundant word line WL_R may refer to a word line that may be used to replace a defective normal word line WL_M.

A first main cell region Cell1_M according to an example embodiment may include the normal word lines WL_M. A first repair cell region Cell1_R according to an example embodiment may include the redundant word lines WL_R. The second cell region Cell2 according to an example embodiment may include a second main cell region Cell2_M or a second repair cell region Cell2_R. A second main cell region Cell2_M according to an example embodiment may include the normal word lines WL_M. A second repair cell region Cell2_R according to an example embodiment may include the redundant word lines WL_R. According to an example embodiment, the first cell region Cell1 may be connected to a first string select line SSL1, and the second cell region Cell2 may be connected to a second string select line SSL2.

According to an example embodiment, a first word line may refer to the normal word line included in the first cell region Cell1, and a second word line may refer to the normal word line included in the second cell region Cell2. According to an example embodiment, the first word line and the second word line may be connected to each other through a common line CL.

According to an example embodiment, the first word line may be present in the first cell region Cell1, the second word line may be present in the second cell region Cell2, and the first word line and the second word line may be connected to each other through the common line CL. The common lines CL may be connected to different decoder units (i.e., decoder circuits or X-DEC), respectively. The main region 110 according to an example embodiment may include first decoder units 133_1, 133_2, 133_3, . . . , 133__n_. For example, the word lines in the main region 110 may be present in the first cell region Cell1 and the second cell region Cell2, and may be connected to at least one of the first decoder units 133_1, 133_2, 133_3, . . . , and 133__n_ through the common line CL.

According to an example embodiment, the first redundant word line may be present in the first cell region Cell1, the second redundant word line may be present in the second cell region Cell2, and the first redundant word line and the second redundant word line may be connected to each other through the common line CL, as well as at least one of the first decoder units 133_1, 133_2, 133_3, . . . , and 133_n_. The repair region 120 according to an example embodiment may include second decoder units 134_1, 134_2, 134_3, . . . , 134_n_. For example, the word lines in the repair region 120 may be present in the first cell region Cell1 and the second cell region Cell2, and may be connected to at least one of the second decoder units 134_1, 134_2, . . . , and 134_n_ through the common line CL.

The first word line of the first cell region Cell1 according to an example embodiment may be connected to the first string select line SSL1. The second word line of the second cell region Cell2 according to an example embodiment may be connected to the second string select line SSL2. Because the first cell region Cell1 and the second cell region Cell2 are connected to different string select lines, the memory device 100 according to an example embodiment may independently select the word lines. The first string select line SSL1 may be a string select line configured to select the word line of the first cell region Cell1, and the second string select line SSL2 may be a string select line configured to select the word line of the second cell region Cell2.

In FIG. 3, the first cell region Cell1 and the second cell region Cell2 may be distinguished from each other by addresses assigned thereto. For example, the first cell region Cell1 may be configured to have a first address, and the second cell region Cell2 may be configured to have a second address. The addresses according to an example embodiment may be values assigned at the time of manufacturing the first cell region Cell1 and the second cell region Cell2. The respective decoder units according to an example embodiment may be configured to detect a defective word line based on the address of the cell region. For example, the first decoder units 133_1, 133_2, 133_3, 133_4, . . . , 133_n_ may each distinguish the first word line from the second word line by the first address or the second address.

The first decoder units 133_1, 133_2, 133_3, 133_4, . . . , 133_n_ and the second decoder units 134_1, 134_2, . . . , 134_n_ according to an example embodiment may each include a pass transistor. According to an example embodiment, the first word line and the second word line may be connected to one pass transistor through the common line CL.

Figure 4:
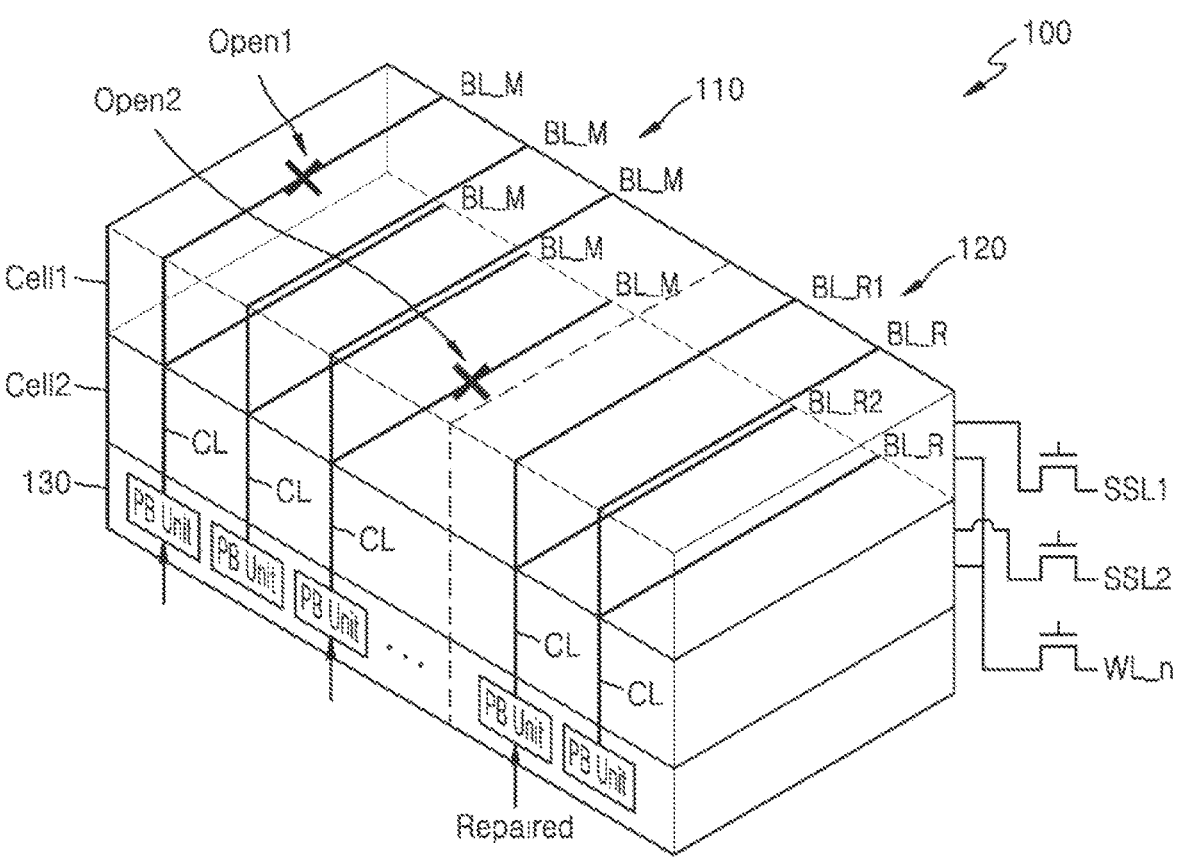
FIGS. 4 and 5 are diagrams for describing a stack structure of a memory device according to an example embodiment.
Figure 5:
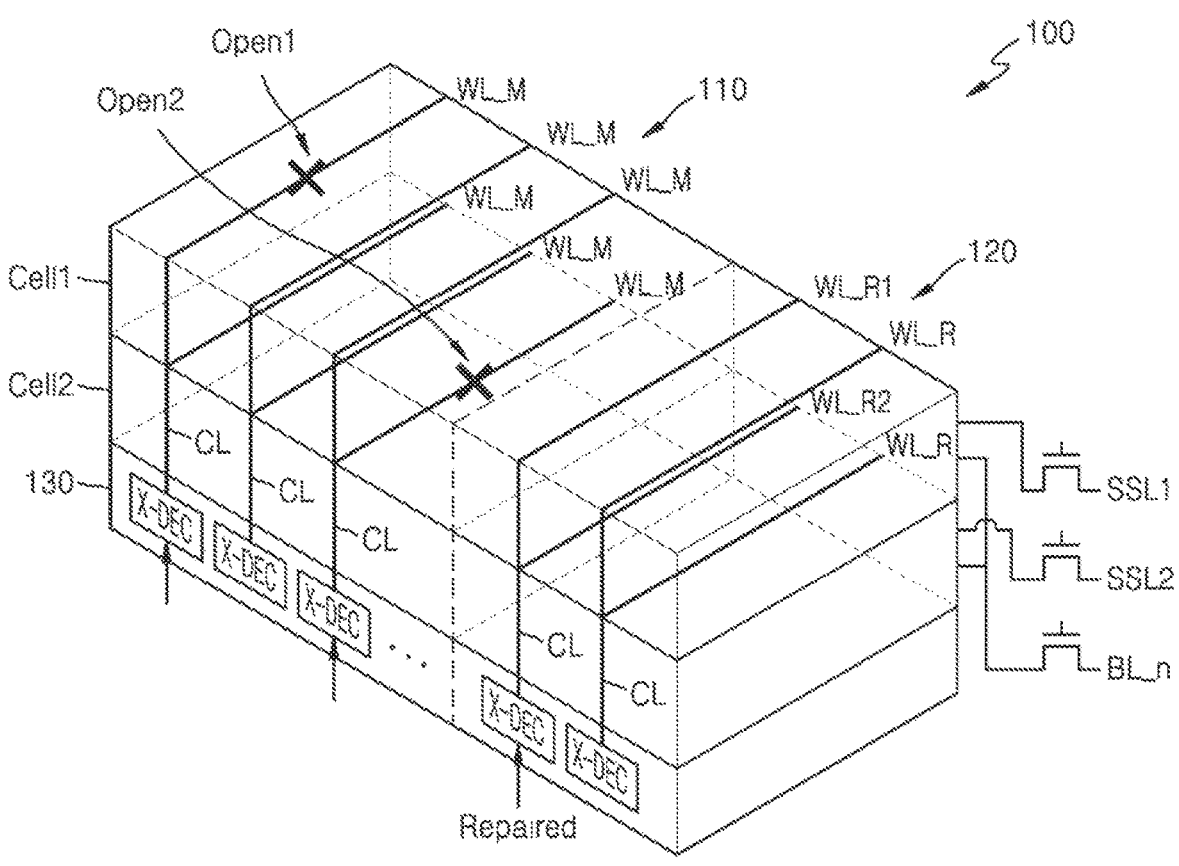

FIGS. 4 and 5 are diagrams for describing a stack structure of a memory device 100 according to an example embodiment. FIG. 4 illustrates a case where an open area occurs in a bit line of the memory device 100 having a stack structure, according to an example embodiment, and FIG. 5 illustrates a case where an open area occurs in a word line of the memory device 100 having a stack structure, according to an example embodiment.

Referring to FIG. 4, open areas may occur in a plurality of normal bit lines BL_M in a main region 110 of the memory device 100 according to an example embodiment. For example, a first open Open1 may occur in a first bit line of a first cell region Cell1 of the main region 110, and a second open Open2 may occur in a second bit line of a second cell region Cell2 of the main region 110. When the first open Open1 occurs in the first bit line of the first cell region Cell1 of the main region 110 and the second open Open2 occurs in the second bit line of the second cell region Cell2 of the main region 110, a first redundant bit line BL_R1 and a second redundant bit line BL_R2 of a repair region 120 according to an example embodiment may replace the first bit line and the second bit line where the open occurs. For example, when the first bit line of the main region 110 is opened, the first bit line may be replaced with the first redundant bit line BL_R1. In addition, when the second bit line of the main region 110 is opened, the second bit line may be replaced with the second redundant bit line BL_R2. The first redundant bit line BL_R1 and the second redundant bit line BL_R2 according to an example embodiment may be connected to each other through a common line CL, as well as one page buffer. In this regard, the first redundant bit line BL_R1 and the second redundant bit line BL_R2 may share the one page buffer. According to an example embodiment, a repaired bit line may be generated by connecting the first redundant bit line BL_R1 and the second redundant bit line BL_R2 to each other through the common line CL.

According to an example embodiment, the first cell region Cell1 may be connected to a first string select line SSL1, and the second cell region Cell2 may be connected to a second string select line SSL2. The first cell region Cell1 and the second cell region Cell2 according to an example embodiment may each include a plurality of word lines WL_n.

Referring to FIG. 5, open areas may occur in a plurality of normal word lines WL_M in a main region 110 of a memory device 100 according to an example embodiment. For example, a first open Open1 may occur in a first word line of a first cell region Cell1 of the main region 110, and a second open Open2 may occur in a second word line of a second cell region Cell2 of the main region 110. When the first open Open1 occurs in the first word line of the first cell region Cell1 of the main region 110 and the second open Open2 occurs in the second word line of the second cell region Cell2 of the main region 110, a first redundant word line WL_R1 and a second redundant word line WL_R2 of a repair region 120 according to an example embodiment may replace the first word line and the second word line where the open occurs. For example, when the first word line of the main region 110 is opened, the first word line may be replaced with the first redundant word line WL_R1. In addition, when the second word line of the main region 110 is opened, the second word line may be replaced with the second redundant word line WL_R2. The first redundant word line WL_R1 and the second redundant word line WL_R2 according to an example embodiment may be connected to each other through a common line CL, as well as one decoder unit. According to an example embodiment, a repaired word line may be generated by connecting the first redundant word line WL_R1 and the second redundant word line WL_R2 to each other through the common line CL.

According to an example embodiment, the first cell region Cell1 may be connected to a first string select line SSL1, and the second cell region Cell2 may be connected to a second string select line SSL2. The first cell region Cell1 and the second cell region Cell2 according to an example embodiment may each include a plurality of bit lines.

Figure 6:
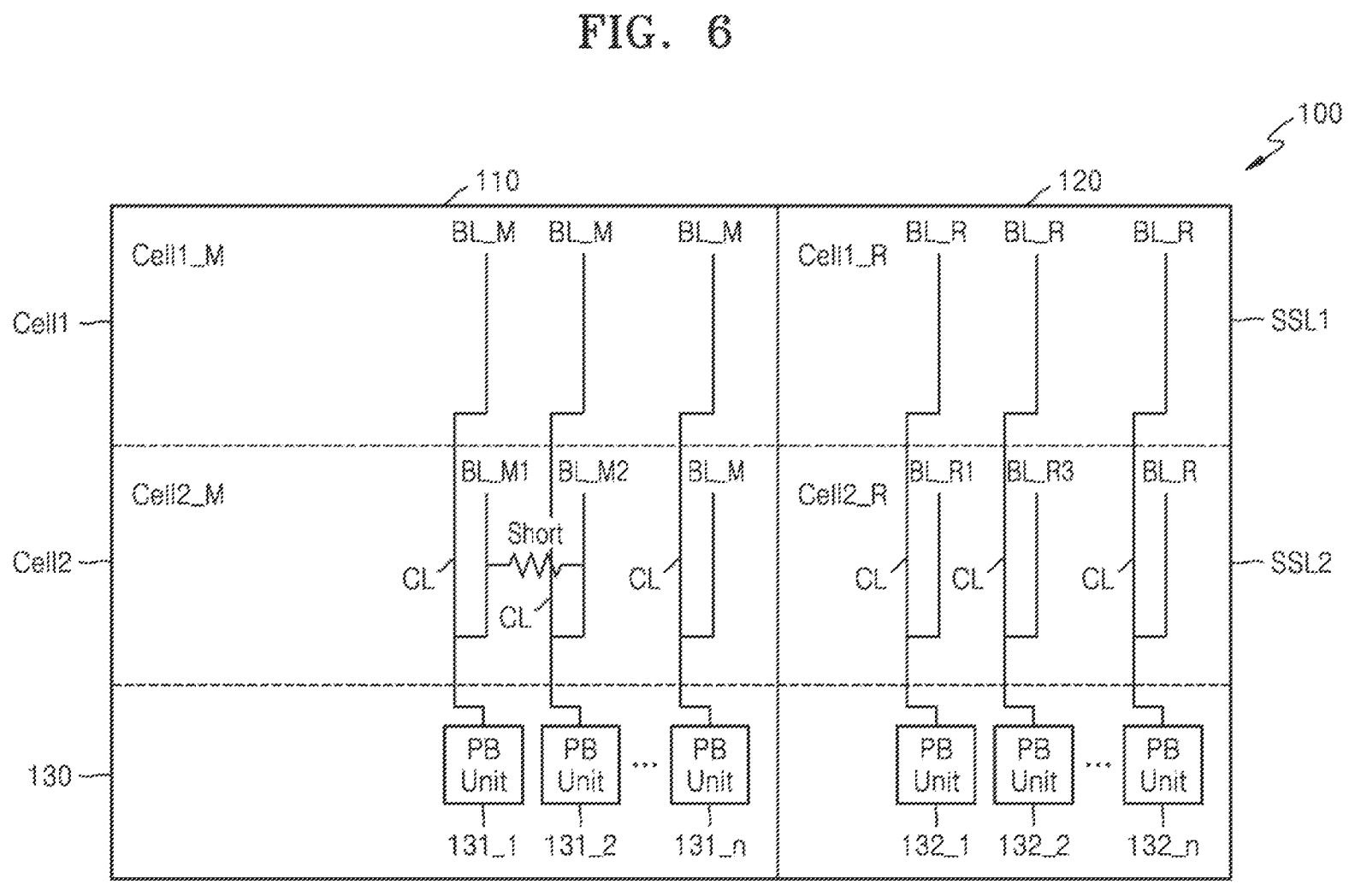
Figure 7:
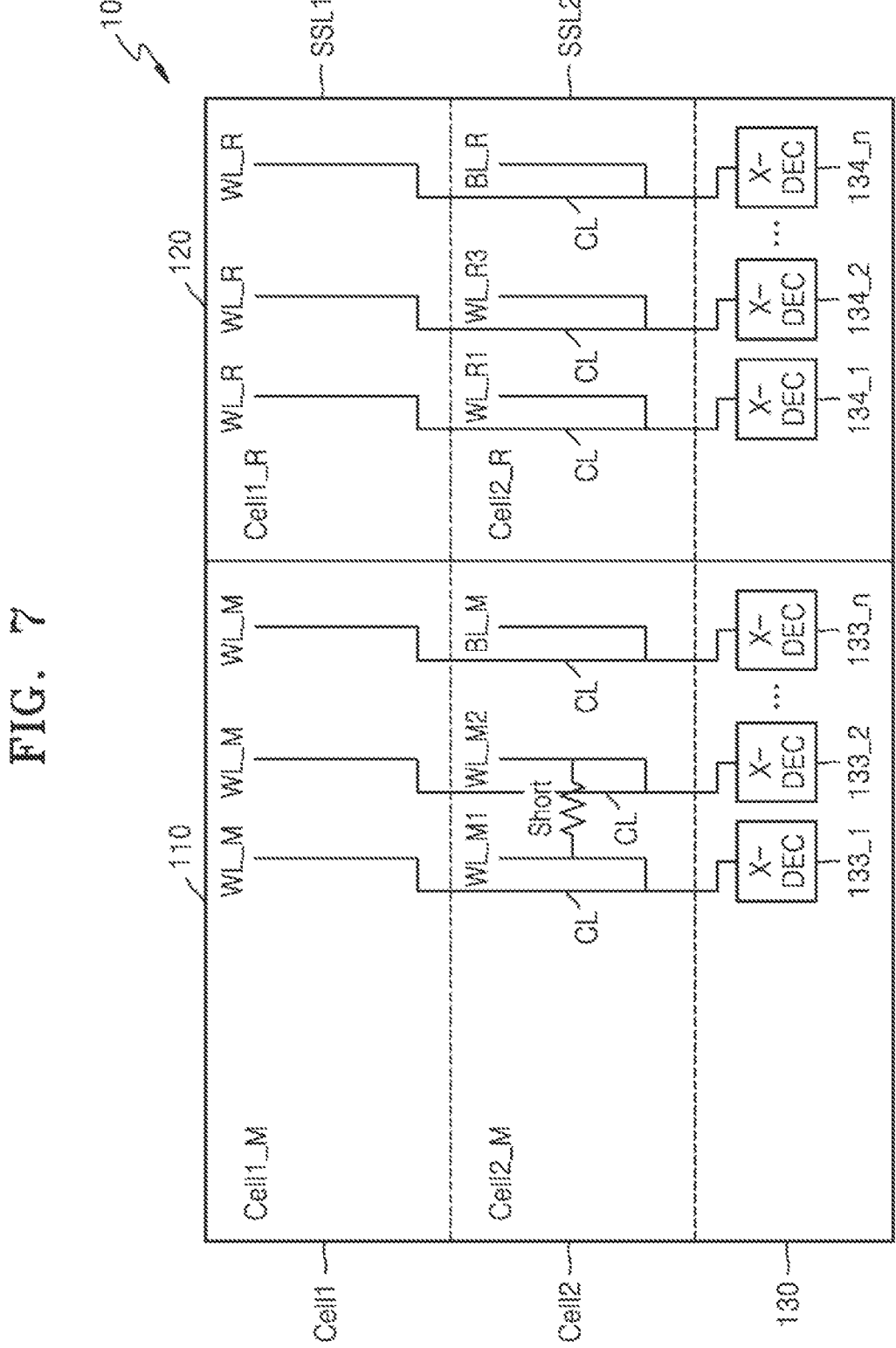
FIG. 7 is a diagram for describing a case where a short occurs in a word line in a memory device, according to an example embodiment.

FIG. 6 is a diagram for describing a case where a short occurs in a bit line in a memory device 100, according to an example embodiment, and FIG. 7 is a diagram for describing a case where a short occurs in a word line in a memory device 100, according to an example embodiment.

Referring to FIG. 6, when a short occurs between a second bit line BL_M2 and an arbitrary bit line BL_M1 adjacent to the second bit line BL_M2 in the memory device 100 according to an example embodiment, the second bit line BL_M2 may be replaced with a first redundant bit line BL_R1 and the shorted arbitrary bit line BL_M1 may be replaced with a third redundant bit line BL_R3. The third redundant bit line BL_R3 according to an example embodiment may be a redundant bit line connected to a second page buffer 132_2 that is different from a first page buffer 132_1. That is, in the memory device 100 according to an example embodiment, when a short occurs between bit lines, the shorted bit lines may be replaced with separate bit lines having separate page buffers, instead of being replaced with redundant bit lines that are connected to each other through the common line CL and share one page buffer.

FIG. 7 is a diagram for describing a case where a short occurs in a word line in a memory device 100, according to an example embodiment.

Referring to FIG. 7, when a short occurs between a second word line WL_M2 and an arbitrary word line WL_M1 adjacent to the second word line WL_M2 in the memory device 100 according to an example embodiment, the second word line WL_M2 may be replaced with a first redundant word line WL_R1 and the shorted arbitrary word line WL_M1 may be replaced with a third redundant word line WL_R3. The third redundant word line WL_R3 according to an example embodiment may be a redundant word line connected to a second decoder unit 134_2 that is different from a first decoder unit 134_1. That is, when a short occurs between word lines in the memory device 100 according to an example embodiment, the shorted word lines may be replaced with separate word lines having separate decoder units, instead of being replaced with redundant word lines that are connected to each other through the common line CL and share one decoder unit.

Figure 8:
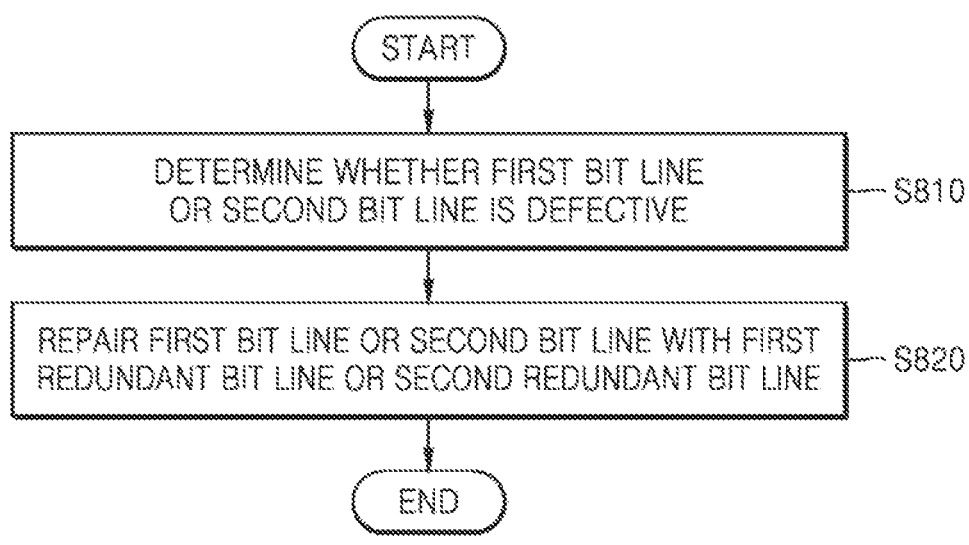
FIG. 8 is a flowchart of a repair method of a memory device, according to an example embodiment.

FIG. 8 is a flowchart of a repair method of the memory device 100, according to an example embodiment.

Referring to FIG. 8, the memory device 100 according to an example embodiment may determine whether the first bit line or the second bit line is defective, in order to perform a repair operation on a defective bit line (S810).

According to an example embodiment, when a bit line is opened or a short occurs between adjacent bit lines, the memory device 100 may determine that the bit line is defective. According to an example embodiment, a first bit line may refer to the normal bit line included in the first cell region Cell1, and a second bit line may refer to the normal bit line included in the second cell region Cell2. According to an example embodiment, the first bit line and the second bit line may be connected to each other through the common line CL. According to an example embodiment, the first bit line may be present in the first cell region Cell1, the second bit line may be present in the second cell region Cell2, and the first bit line and the second bit line may be connected to each other through the common line CL, may share one page buffer, or may be connected to different page buffers among a plurality of page buffers.

According to an example embodiment, when the memory device determines that the first bit line or the second bit line is defective, the memory device 100 may repair the first bit line or the second bit line with the first redundant bit line or the second redundant bit line (S820).

According to an example embodiment, when the first bit line is defective, the memory device 100 may replace the first bit line of the first cell region Cell1 with the first redundant bit line. According to an example embodiment, when the second bit line is defective, the memory device 100 may replace the second bit line with the second redundant bit line.

According to an example embodiment, the first redundant bit line may be present in the first cell region Cell1, the second redundant bit line may be present in the second cell region Cell2, and the first redundant bit line and the second redundant bit line may be connected to each other through the common line CL, as well as at least one of the second page buffers. The repair region 120 according to an example embodiment may include second page buffers. For example, the bit lines in the repair region 120 may be present in the first cell region Cell1 and the second cell region Cell2, and may be connected to at least one of the second page buffers through the common line CL.

Figure 9:
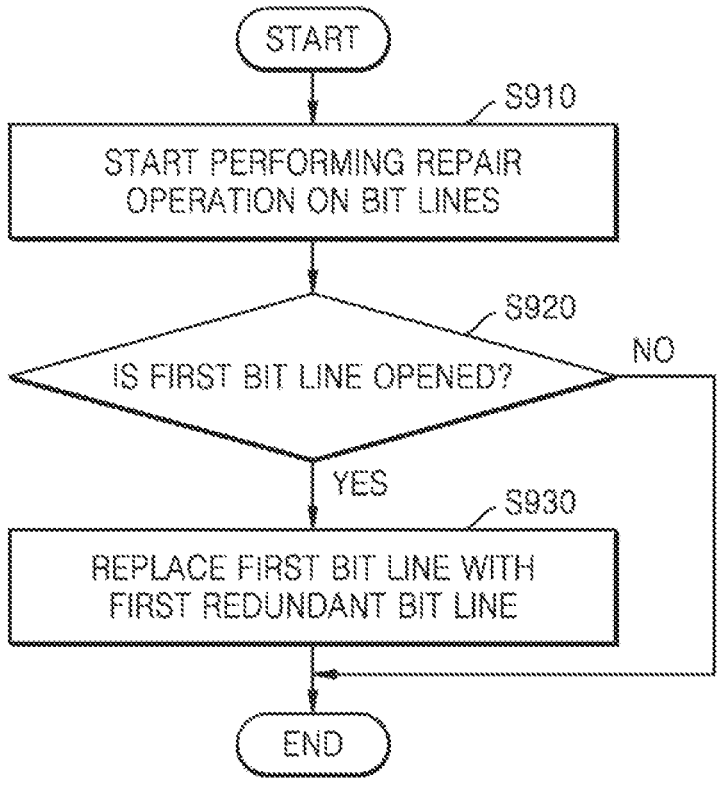
FIGS. 9 and 10 are flowcharts of a repair method of a memory device when a bit line is opened, according to an example embodiment.
Figure 10:
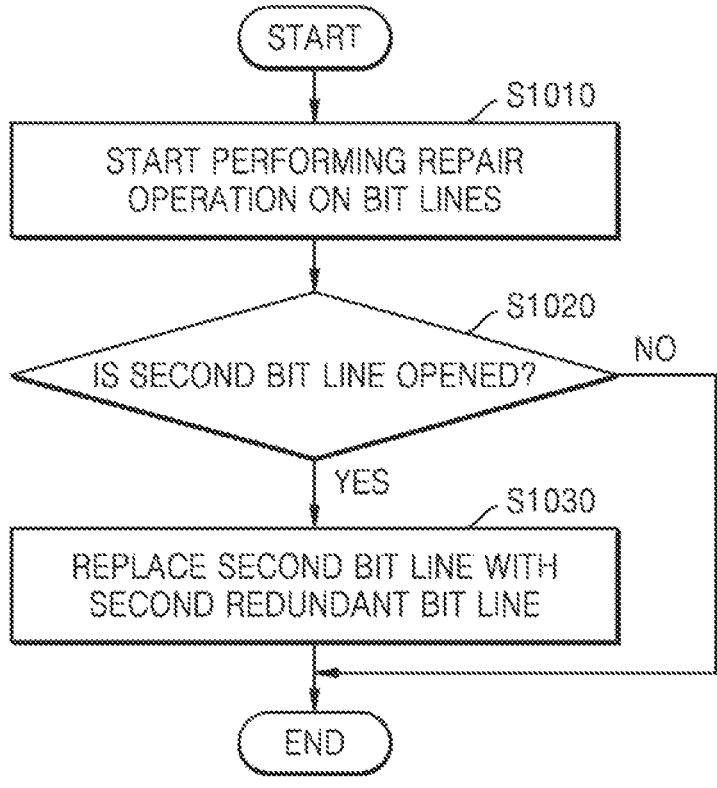

FIGS. 9 and 10 are flowcharts of a repair method of a memory device when a bit line is opened, according to an example embodiment.

FIG. 9 is a flowchart of a method of repairing the first bit line when the open area is present in the first bit line of the memory device 100.

Referring to FIG. 9, the memory device 100 according to an example embodiment may start performing a repair operation on bit lines (S910). The repair operation according to an example embodiment may include replacing a defective bit line with a redundant bit line.

The memory device 100 according to an example embodiment may determine whether the first bit line is opened (S920).

Open areas may occur in the normal bit lines BL_M in the main region 110 of the memory device 100 according to an example embodiment. For example, the first open may occur in the first bit line of the first cell region Cell1 of the main region 110.

According to an example embodiment, when the memory device determines that the first bit line is opened, the memory device 100 may replace the first bit line with the first redundant bit line (S930).

For example, when the first open occurs in the first bit line of the first cell region Cell1 of the main region 110, the first redundant bit line of the repair region 120 may replace the opened first bit line. For example, when the first bit line of the main region 110 is opened, the first bit line may be replaced with the first redundant bit line.

However, according to an example embodiment, when the memory device determines that the first bit line is not opened, the memory device 100 may not perform the repair operation.

FIG. 10 is a flowchart of a method of repairing the second bit line when the open area is present in the second bit line of the memory device 100.

Referring to FIG. 10, the memory device 100 according to an example embodiment may start performing a repair operation on bit lines (S1010). The repair operation according to an example embodiment may include replacing a defective bit line with a redundant bit line.

The memory device 100 according to an example embodiment may determine whether the second bit line is opened (S1020).

Open areas may occur in the normal bit lines BL_M in the main region 110 of the memory device 100 according to an example embodiment. For example, the second open may occur in the second bit line of the second cell region Cell2 of the main region 110.

According to an example embodiment, when the memory device determines that the second bit line is opened, the memory device 100 may replace the second bit line with the second redundant bit line (S1030).

For example, when the second open occurs in the second bit line of the second cell region Cell2 of the main region 110, the second redundant bit line of the repair region 120 may replace the opened second bit line. For example, when the second bit line of the main region 110 is opened, the second bit line may be replaced with the second redundant bit line.

However, according to an example embodiment, when the memory device 100 determines that the second bit line is not opened, the memory device 100 may not perform the repair operation.

The first redundant bit line and the second redundant bit line described with reference to FIGS. 9 and 10 may share one page buffer through the common line.

Figure 11:
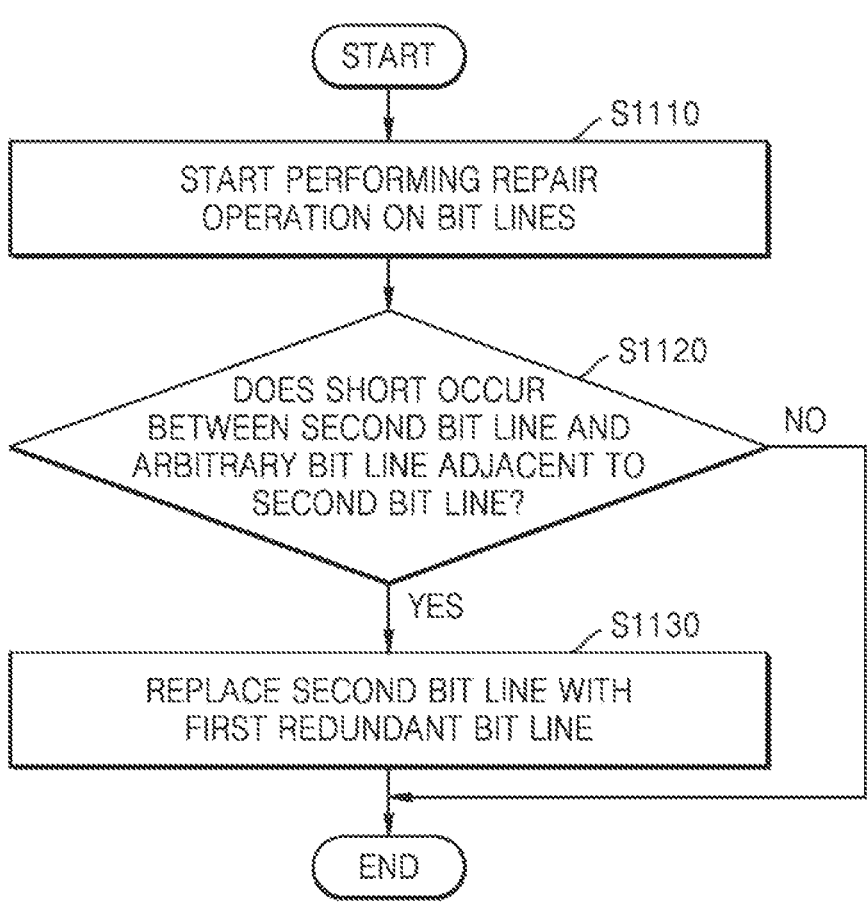
FIGS. 11 and 12 are flowcharts of a repair method of a memory device when a short occurs in a bit line, according to an example embodiment.
Figure 12:
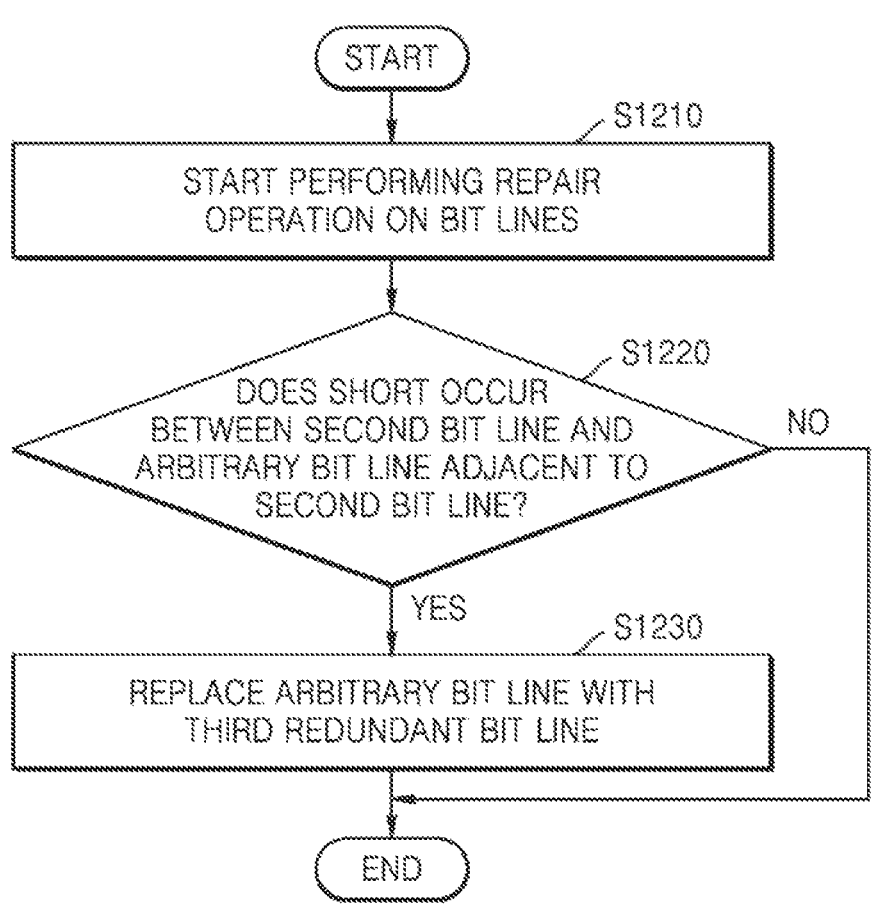

FIGS. 11 and 12 are flowcharts of a repair method of a memory device when a short occurs in a bit line, according to an example embodiment. FIG. 11 is a flowchart of a process of performing a repair operation on the second bit line when a short occurs between the second bit line and the arbitrary bit line adjacent to the second bit line, according to an example embodiment, and FIG. 12 is a flowchart of a process of performing a repair operation on the arbitrary bit line when a short circuit occurs between the second bit line and the arbitrary bit line adjacent to the second bit line, according to an example embodiment.

Referring to FIG. 11, the memory device 100 according to an example embodiment may start performing a repair operation on bit lines (S1110). The repair operation according to an example embodiment may include replacing a defective bit line with a redundant bit line.

The memory device 100 according to an example embodiment may determine whether a short occurs between the second bit line and the arbitrary bit line adjacent to the second bit line (S1120).

According to an example embodiment, when the memory device determines that a short occurs between the second bit line and the arbitrary bit line adjacent to the second bit line, the memory device 100 may replace the second bit line with the first redundant bit line (S1130). According to an example embodiment, when a short occurs between the second bit line of the memory device 100 and the arbitrary bit line adjacent to the second bit line, the memory device 100 may replace the second bit line with the first redundant bit line and may not replace the adjacent arbitrary bit line with the second redundant bit line. According to an example embodiment, the first redundant bit line may be connected to the first page buffer.

However, according to an example embodiment, when the memory device 100 determines that a short does not occur between the second bit line and the arbitrary bit line adjacent to the second bit line, the memory device 100 may not perform the repair operation.

Referring to FIG. 12, the memory device 100 according to an example embodiment may start performing a repair operation on bit lines (S1210). The repair operation according to an example embodiment may include replacing a defective bit line with a redundant bit line.

The memory device 100 according to an example embodiment may determine whether a short occurs between the second bit line and the arbitrary bit line adjacent to the second bit line (S1220).

According to an example embodiment, when the memory device determines that a short occurs between the second bit line and the arbitrary bit line adjacent to the second bit line, the memory device 100 may replace the shorted arbitrary bit line with the third redundant bit line (S1230). According to an example embodiment, when a short occurs between the second bit line of the memory device 100 and the arbitrary bit line adjacent to the second bit line, the memory device 100 may replace the shorted arbitrary bit line with the third redundant bit line. The third redundant bit line according to an example embodiment may be a redundant bit line connected to a second page buffer that is different from the first page buffer described in the example embodiment of FIG.

11. That is, when a short occurs between bit lines in the memory device 100 according to an example embodiment, the shorted bit lines may be replaced with separate bit lines having separate page buffers, instead of being replaced with redundant bit lines that are connected to each other through the common line CL and share one page buffer.

However, according to an example embodiment, when the memory device 100 determines that a short does not occur between the second bit line and the arbitrary bit line adjacent to the second bit line, the memory device 100 may not perform the repair operation.

Figure 13:
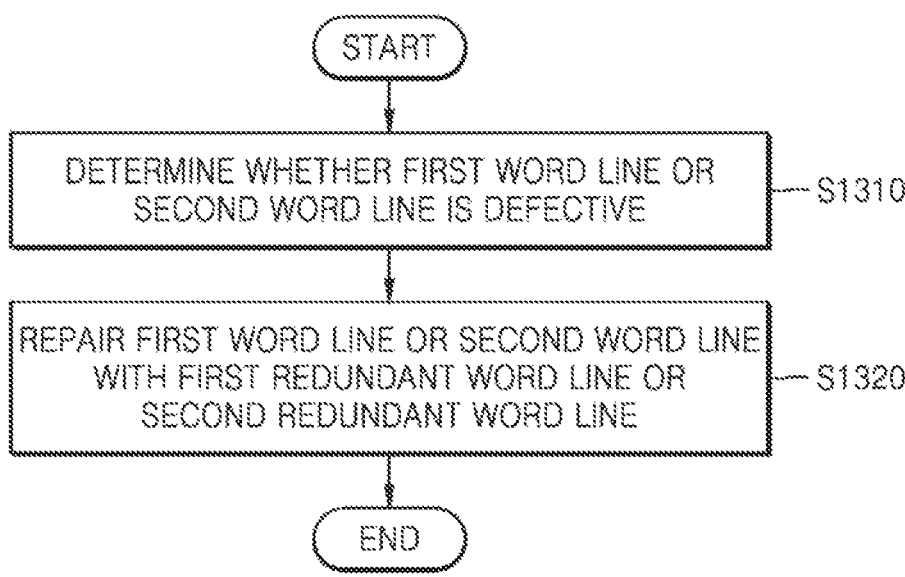
FIG. 13 is a flowchart of a repair method of a memory device when a repair operation is performed on a word line, according to an example embodiment.

FIG. 13 is a flowchart of a repair method of the memory device 100 when a repair operation is performed on a word line, according to an example embodiment.

Referring to FIG. 13, the memory device 100 according to an example embodiment may determine whether the first word line or the second word line is defective, in order to perform a repair operation on a defective word line (S1310).

According to an example embodiment, when a word line is opened or a short occurs between adjacent word lines, the memory device 100 may determine that the word line is defective. According to an example embodiment, a first word line may refer to the normal word line included in the first cell region Cell1, and a second word line may refer to the normal word line included in the second cell region Cell2. According to an example embodiment, the first word line and the second word line may be connected to each other through a common line CL. According to an example embodiment, the first word line may be present in the first cell region Cell1, the second word line may be present in the second cell region Cell2, and the first word line and the second word line may be connected to each other through the common line CL. The first word line and the second word line may be connected to different decoder units among the decoder units. According to an example embodiment, when the memory device determines that the first word line or the second word line is defective, the memory device 100 may repair the first word line or the second word line with the first redundant word line or the second redundant word line (S1320).

According to an example embodiment, when the first word line is defective, the memory device 100 may replace the first word line of the first cell region Cell1 with the first redundant word line. According to an example embodiment, when the second word line is defective, the memory device 100 may replace the second word line with the second redundant word line.

According to an example embodiment, the first redundant word line may be present in the first cell region Cell1, the second redundant word line may be present in the second cell region Cell2, and the first redundant word line and the second redundant word line may be connected to each other through the common line CL, as well as at least one of the decoder units. The repair region 120 according to an example embodiment may include decoder units. For example, the word lines in the repair region 120 may be present in the first cell region Cell1 and the second cell region Cell2, and may be connected to at least one of the decoder units through the common line CL.

Figure 14:
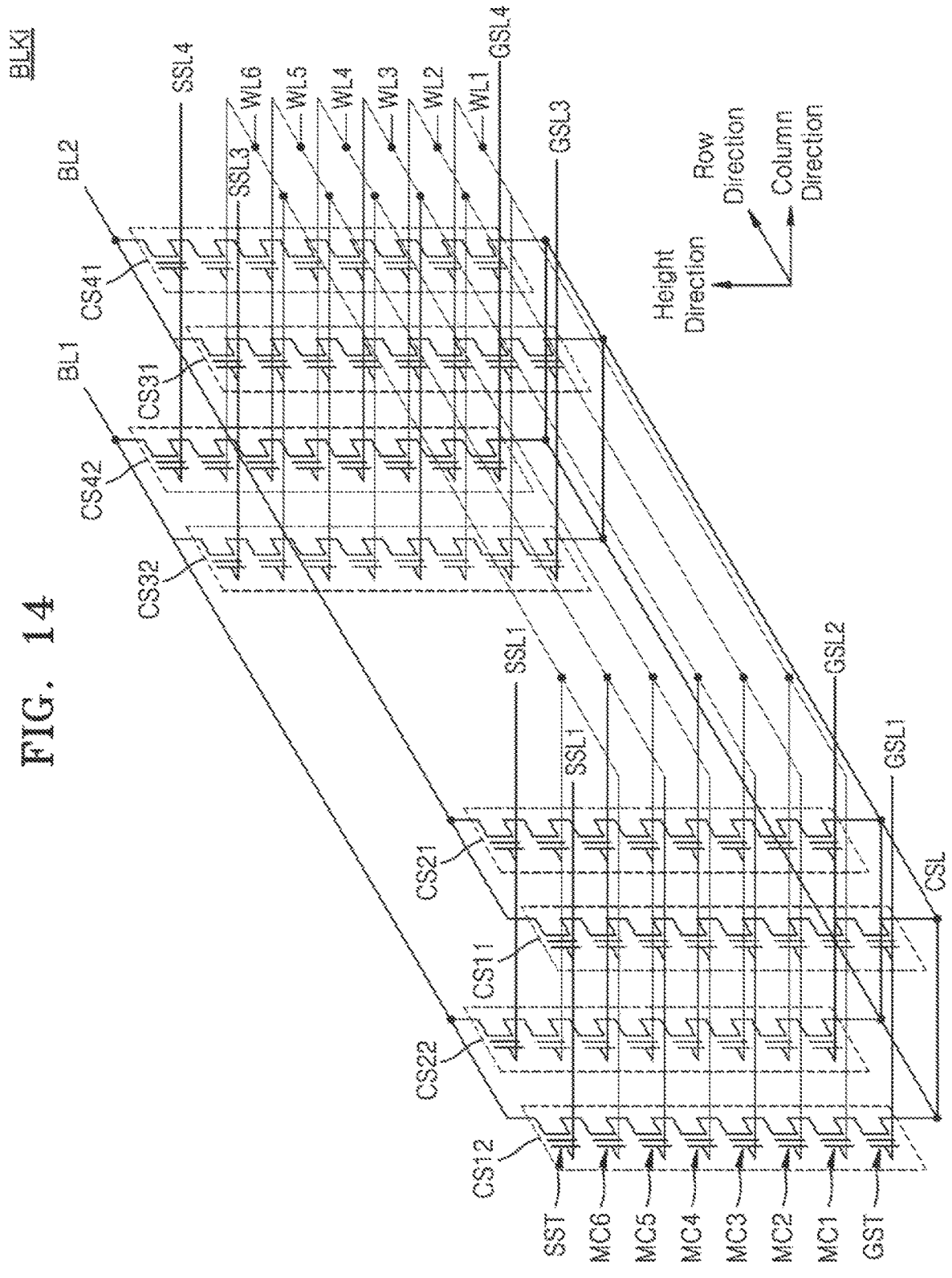
FIG. 14 is a circuit diagram illustrating a memory block according to an example embodiment.

FIG. 14 is a circuit diagram illustrating a memory block BLKi according to an example embodiment.

Referring to FIG. 14, the memory block BLKi may include a plurality of cell strings CS11 to CS41 and CS12 to CS42. The cell strings CS11 to CS41 and CS12 to CS42 may be arranged in row and column directions to form rows and columns.

The cell strings may each include a ground select transistor GST, memory cells MC1 to MC6, and a string select transistor SST. The ground select transistor GST, the memory cells MC1 to MC6, and the string select transistor SST of each of the cell strings may be stacked in a height direction perpendicular to a substrate.

The rows of the cell strings CS11 to CS41 and CS12 to CS42 may be respectively connected to different string select lines SSL1 to SSL4. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The columns of the cell strings CS11 to CS41 and CS12 to CS42 may be respectively connected to different bit lines BL1 and BL2. For example, the string select transistors SST of the cell strings CS11 to CS41 may be commonly connected to the bit line BL1. The string select transistors SST of the cell strings CS12 and CS42 may be commonly connected to the bit line BL2.

The rows of the cell strings CS11 to CS41 and CS12 to CS42 may be respectively connected to different ground select lines GSL1 to GSL4. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

Memory cells located at the same height from the substrate (or the ground select transistors GST) may be commonly connected to one word line, and memory cells located at different heights may be respectively connected to different word lines WL1 to WL6. For example, memory cells MC1 of the cell strings CS11 to CS41 and CS12 to CS42 may be commonly connected to the word line WL1. Memory cells MC2 of the cell strings CS11 to CS41 and CS12 to CS42 may be commonly connected to the word line WL2. Memory cells MC3 of the cell strings CS11 to CS41 and CS12 to CS42 may be commonly connected to the word line WL3. Memory cells MC4 of the cell strings CS11 to CS41 and CS12 to CS42 may be commonly connected to the word line WL4. Memory cells MC5 of the cell strings CS11 to CS41 and CS12 to CS42 may be commonly connected to the word line WL5. Memory cells MC6 of the cell strings CS11 to CS41 and CS12 to CS42 may be commonly connected to the word line WL6.

The ground select transistors GST of the cell strings CS11 to CS41 and CS12 to CS42 may be commonly connected to a common source line CSL.

The memory block BLKi illustrated in FIG. 14 is only an example. Example embodiments are not limited to the memory block BLKi illustrated in FIG. 14. For example, the number of rows of the cell strings may increase or decrease. As the number of rows of the cell strings is changed, the number of string select lines connected to the rows of the cell strings and the number of cell strings connected to one bit line may also be changed. As the number of rows of the cell strings is changed, the number of ground select lines connected to the rows of the cell strings may also be changed.

The number of columns of the cell strings may increase or decrease. As the number of columns of the cell strings is changed, the number of bit lines connected to the columns of the cell strings and the number of cell strings connected to one string select line may also be changed.

The height of the cell strings may increase or decrease. For example, the number of memory cells stacked in each of the cell strings may increase or decrease. As the number of memory cells stacked in each of the cell strings is changed, the number of word lines may also be changed. For example, the number of string select transistors or ground select transistors provided in each of the cell strings may increase. As the number of string select transistors or ground select transistors provided in each of the cell strings is changed, the number of string select lines or ground select lines may also be changed. When the number of string select transistors or ground select transistors increases, the string select transistors or the ground select transistors may be stacked in the same form as the memory cells MC1 to MC6.

For example, a write operation and a read operation may be performed in units of rows of the cell strings CS11 to CS41 and CS12 to CS42. The cell strings CS11 to CS41 and CS12 to CS42 may be selected in units of one row by the ground select lines GSL1 to GSL4, and the cell strings CS11 to CS41 and CS12 to CS42 may be selected in units of one row by the string select lines SSL1 to SSL4. In addition, a voltage may be applied to the ground select lines GSL1 to GSL4 based on at least two ground select lines GSL1 and GSL2 or GSL3 and GSL4 as one unit. A voltage may be applied to the ground select lines GSL1 to GSL4 collectively as one unit. The ground select lines GSL1 to GSL4 according to an example embodiment may be programmed to have a preset threshold voltage.

In the selected row of the cell strings CS11 to CS41 and CS12 to CS42, a write operation and a read operation may be performed in units of pages. The page may be one row of the memory cells connected to one word line. In the selected rows of the cell strings CS11 to CS41 and CS12 to CS42, the memory cells may be selected in units of pages by the word lines WL1 to WL6.

Figure 15:
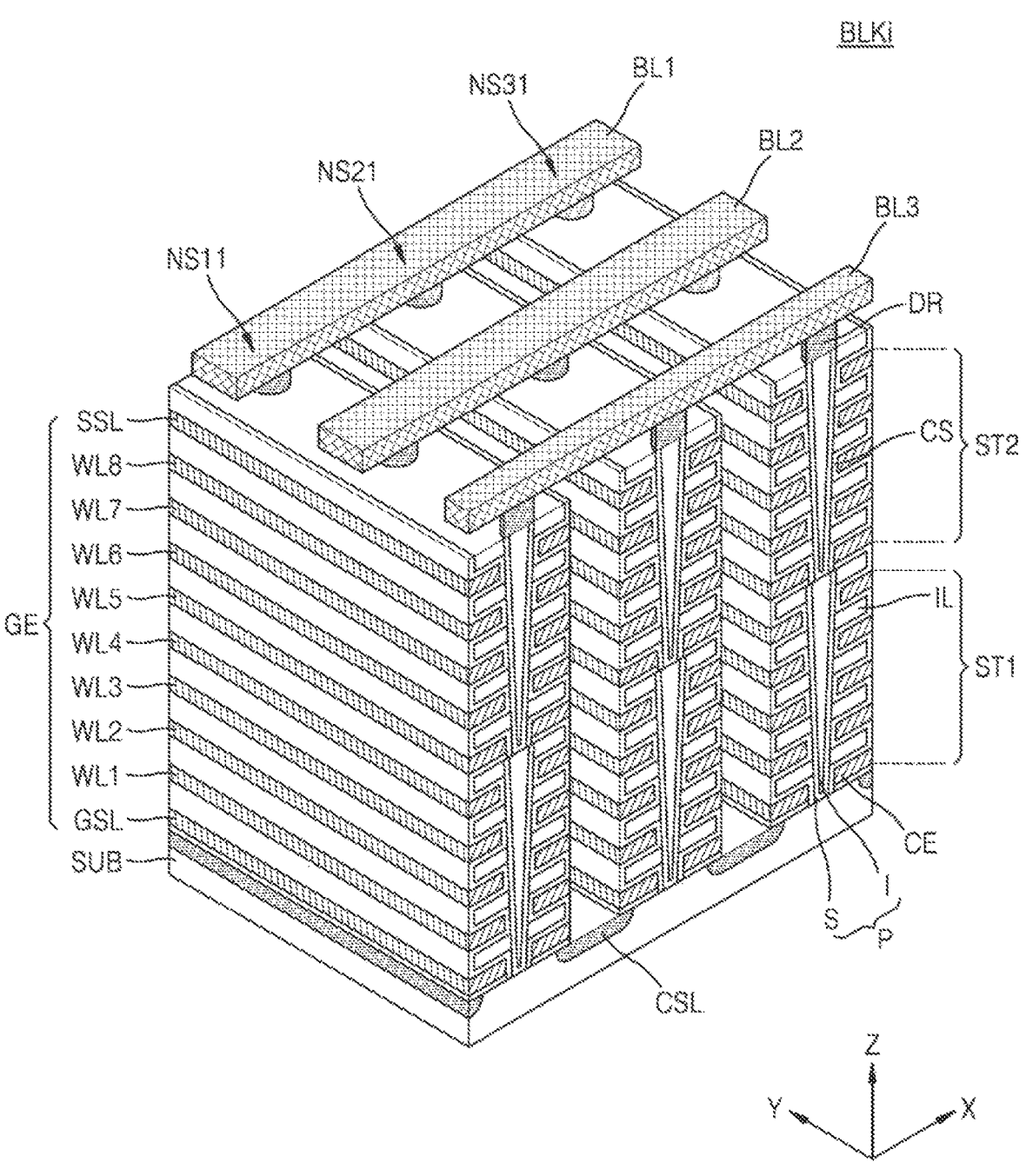
FIG. 15 is a diagram for describing a three-dimensional (3D) V-NAND structure applicable to a memory device, according to an example embodiment.

FIG. 15 is a diagram for describing a three-dimensional (3D) V-NAND structure applicable to a memory device, according to an example embodiment.

Referring to FIG. 15, a memory block BLKi may be formed in a direction perpendicular to a substrate SUB. Memory cells constituting memory NAND strings NS11 to NS33 may be stacked on a plurality of semiconductor layers.

Common source lines CSL extending in a first direction (Y direction) may be provided on the substrate SUB. A plurality of insulating layers IL extending in the first direction (Y direction) may be sequentially provided on an area of the substrate SUB between two adjacent common source lines CSL in a third direction (Z direction), and the insulating layers IL may be spaced apart from each other by a specific distance in the third direction (Z direction). A plurality of pillars P may be sequentially arranged on the area of the substrate SUB between the two adjacent common source lines CSL in the first direction (Y direction), and may pass through the insulating layers IL in the third direction (Z direction). The pillars P may pass through the insulating layers IL and come in contact with the substrate SUB. A surface layer S of each of the pillars P may include a silicon material doped with a first conductivity type and may function as a channel region.

An inner layer I of each of the pillars P may include an air gap or an insulating material such as silicon oxide. A charge storage layer CS may be provided along the exposed surfaces of the substrate SUB, the pillars P, and the insulating layers IL in the area between the two adjacent common source lines CSL. The charge storage layer CS may include a gate insulating layer (referred to as a tunneling insulating layer), a charge trap layer, and a blocking insulating layer. In addition, gate electrodes GE, such as select lines GSL and SSL, and word lines WL1 to WL8 may be provided on the exposed surface of the charge storage layer CS in the area between the two adjacent common source lines CSL. Drains or drain contacts DR may be respectively provided on the pillars P. Bit lines BL1 to BL3 extending in the second direction (X direction) and spaced apart from each other by a certain distance in the first direction (Y direction) may be provided on the drain contacts DR.

As illustrated in FIG. 15, the memory NAND strings NS11 to NS33 may be implemented as a structure in which a first memory stack ST1 and a second memory stack ST2 are stacked. The first memory stack ST1 may be connected to the common source line CSL, the second memory stack ST2 may be connected to the bit lines BL1 to BL3, and first memory stack ST1 and the second memory stack ST2 may be stacked to share a channel hole with each other.

Figure 16:
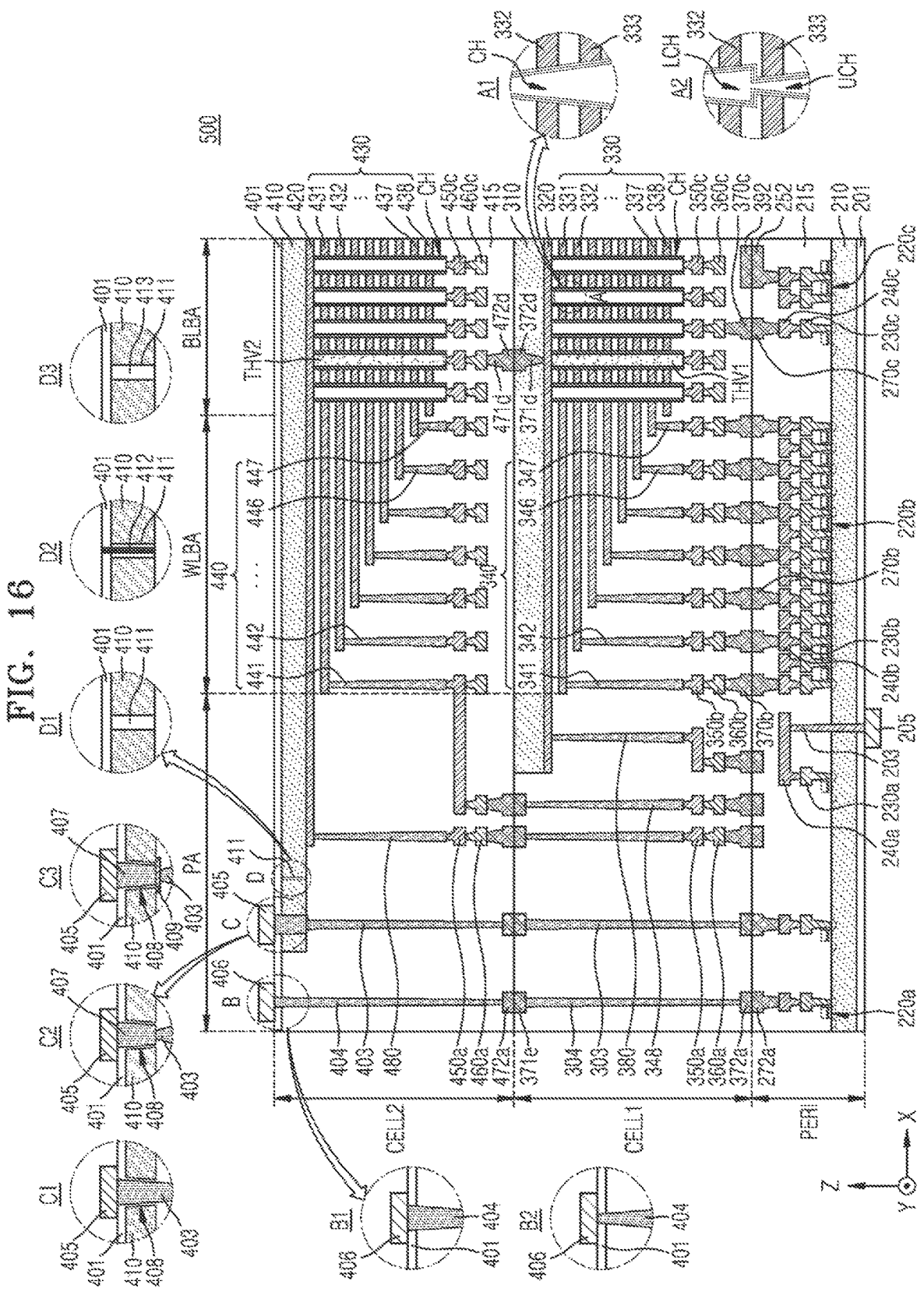
FIG. 16 is a cross-sectional view of a memory device having a B-VNAND structure, according to an example embodiment.

FIG. 16 is a cross-sectional view of a memory device 500 having a B-VNAND structure, according to an example embodiment.

FIG. 16 is a diagram for describing the memory device 500 according to an example embodiment.

Referring to FIG. 16, the memory device 500 may have a chip-to-chip (C2C) structure. The C2C structure may refer to a structure formed by manufacturing at least one upper chip including a cell region CELL and a lower chip including a peripheral circuit region PERI and then bonding the at least one upper chip and the lower chip to each other. The bonding process may include a method of electrically or physically connecting a bonding metal pattern formed on an uppermost metal layer of the upper chip to a bonding metal pattern formed on an uppermost metal layer of the lower chip. For example, when the bonding metal patterns includes copper (Cu), the bonding process may be Cu-to-Cu bonding As another example, the bonding metal patterns may also include aluminum (Al) or tungsten (W).

The memory device 500 may include at least one upper chip including the cell region. For example, as illustrated in FIG. 16, the memory device 500 may be implemented to include two upper chips. However, this is only an example, and the number of upper chips is not limited thereto. When the memory device 500 is implemented to include two upper chips, the memory device 500 may be manufactured by manufacturing the first upper chip including the first cell region CELL1, the second upper chip including the second cell region CELL2, and the lower chip including the peripheral circuit region PERI and then bonding the first upper chip, the second upper chip, and the lower chip to each other. The first upper chip may be reversed and bonded to the lower chip, and the second upper chip may also be reversed and bonded to the first upper chip. In the following description, upper and lower portions of the first and second upper chips are defined based on a state before the first and second upper chips are reversed. That is, in FIG. 15, the upper portion of the lower chip refers to the upper portion defined with respect to the +Z direction, and the upper portion of each of the first and second upper chips refers to the upper portion defined with respect to the −Z direction. However, this is only an example, and only one of the first upper chip and the second upper chip may be reversed and bonded to the lower chip.

The peripheral circuit region PERI and the first and second cell regions CELL1 and CELL2 of the memory device 500 may each include an external pad bonding area PA, a word line bonding area WLBA, and a bit line bonding area BLBA.

The peripheral circuit region PERI may include a first substrate 210 and a plurality of circuit elements 220a, 220b, and 220c formed on the first substrate 210. An interlayer insulating layer 215 including one or more insulating layers may be provided on the circuit elements 220a, 220b, and 220c, and a plurality of metal lines connecting the circuit elements 220a, 220b, and 220c may be provided in the interlayer insulating layer 215. For example, the metal lines may include first metal lines 230a, 230b, and 230c respectively connected to the circuit elements 220a, 220b, and 220c, and second metal lines 240a, 240b, and 240c respectively on the first metal lines 230a, 230b, and 230c. The metal lines may include at least one of various conductive materials. For example, the first metal lines 230a, 230b, and 230c may each include tungsten having relatively high electrical resistivity, and the second metal lines 240a, 240b, and 240c may each include copper having relatively low electrical resistivity.

Although only the first metal lines 230a, 230b, and 230c and the second metal lines 240a, 240b, and 240c are illustrated and described, example embodiments are not limited thereto, and one or more additional metal lines may be further formed on the second metal lines 240a, 240b, and 240c. In this case, the second metal lines 240a, 240b, and 240c may each include aluminum. At least some of the one or more additional metal layers formed on the second metal lines 240a, 240b, and 240c may include copper or the like having lower electrical resistivity than that of aluminum of the second metal lines 240a, 240b, and 240c.

The interlayer insulating layer 215 may be disposed on the first substrate 210 and may include an insulating material, such as silicon oxide or silicon nitride.

The first and second cell regions CELL1 and CELL2 may each include at least one memory block. The first cell region CELL1 may include a second substrate 310 and a common source line 320. A plurality of word lines 331 to 338 (330) may be stacked on the second substrate 310 in a direction (Z direction) perpendicular to the upper surface of the second substrate 310. String select lines and ground select lines may be disposed above and below the word lines 330, and the word lines 330 may be between the string select lines and the ground select lines. Similarly, the second cell region CELL2 may include a third substrate 410 and a common source line 420, and a plurality of word lines 431 to 438 (430) may be stacked in a direction (Z direction) perpendicular to the upper surface of the third substrate 410. The second substrate 310 and the third substrate 410 may each include various materials. For example, the second substrate 310 and the third substrate 410 may each be a silicon substrate, a silicon-germanium substrate, a germanium substrate, or a substrate having a monocrystalline epitaxial layer grown on a monocrystalline silicon substrate. A plurality of channel structures CH may be formed in each of the first and second cell regions CELL1 and CELL2.

In an example embodiment, as illustrated in A1, the channel structure CH may be provided in the bit line bonding area BLBA and may extend in a direction perpendicular to the upper surface of the second substrate 310 and pass through the word lines 330, the string select lines, and the ground select line. The channel structure CH may include a data storage layer, a channel layer, and a buried insulating layer. The channel layer may be electrically connected to a first metal line 350*c* and a second metal line 360*c* in the bit line bonding area BLBA. For example, the second metal line 360*c* may be a bit line and may be connected to the channel structure CH through the first metal line 350*c*. The second metal line 360*c* that is a bit line may extend in a first direction (Y direction) parallel to the upper surface of the second substrate 310.

In an example embodiment, as illustrated in A2, the channel structure CH may include a lower channel LCH and an upper channel UCH connected to each other. For example, the channel structure CH may be formed through a process for the lower channel LCH and a process for the upper channel UCH. The lower channel LCH may extend in a direction perpendicular to the upper surface of the second substrate 310 and pass through the common source line 320 and the lower word lines 331 and 332. The lower channel LCH may include a data storage layer, a channel layer, and a buried insulating layer and may be connected to the upper channel UCH. The upper channel UCH may pass through the upper word lines 333 to 338. The upper channel UCH may include a data storage layer, a channel layer, and a buried insulating layer, and the channel layer of the upper channel UCH may be electrically connected to the first metal line 350*c* and the second metal line 360*c*. As the length of the channel increases, it may be difficult to form a channel having a constant width in view of process. The memory device 500 according to an example embodiment may include a channel having improved width uniformity through the lower channel LCH and the upper channel UCH formed through sequential processes.

As illustrated in A2, when the channel structure CH is formed to include the lower channel LCH and the upper channel UCH, a word line located near the boundary between the lower channel LCH and the upper channel UCH may be a dummy word line. For example, the word line 332 and the word line 333 forming the boundary between the lower channel LCH and the upper channel UCH may be dummy word lines. In this case, data may not be stored in memory cells connected to the dummy word lines. Alternatively, the number of pages corresponding to the memory cells connected to the dummy word lines may be less than the number of pages corresponding to the memory cells connected to the normal word lines. A voltage level applied to the dummy word line may be different from a voltage level applied to the normal word line. Accordingly, the influence of the non-uniform channel width between the lower channel LCH and the upper channel UCH on the operation of the memory device may be reduced.

As illustrated, the number of lower word lines 331 and 332 through which the lower channel LCH passes may be less than the number of upper word lines 333 to 338 through which the upper channel UCH passes. However, this is only an example, and example embodiments are not limited thereto. As another example, the number of lower word lines through which the lower channel LCH passes may be equal to or greater than the number of upper word lines through which the upper channel UCH passes. In addition, the above-described structure and connection relationship of the channel structure CH arranged in the first cell region CELL1 may be equally applied to the channel structure CH arranged in the second cell region CELL2.

In the bit line bonding area BLBA, a first through electrode THV1 may be provided in the first cell region CELL1, and a second through electrode THV2 may be provided in the second cell region CELL2. As illustrated in FIG. 16, the first through electrode THV1 may pass through the common source line 320 and the word lines 330. However, this is only an example, and the first through electrode THV1 may further pass through the second substrate 310. The first through electrode THV1 may include a conductive material. Alternatively, the first through electrode THV1 may include a conductive material surrounded by an insulating material. The second through electrode THV2 may also be provided in the same shape and structure as the first through electrode THV1.

In an example embodiment, the first through electrode THV1 and the second through electrode THV2 may be electrically connected through a first through metal pattern 372*d* and a second through metal pattern 472*d*, respectively. The first through metal pattern 372*d* may be formed at the lower end of the first upper chip including the first cell region CELL1, and the second through metal pattern 472*d* may be formed at the upper end of the second upper chip including the second cell region CELL2. The first through electrode THV1 may be electrically connected to the first metal line 350*c* and the second metal line 360*c*. A lower via 371*d* may be formed between the first through electrode THV1 and the first through metal pattern 372*d*, and an upper via 471*d* may be formed between the second through electrode THV2 and the second through metal pattern 472*d*. The first through metal pattern 372*d* and the second through metal pattern 472*d* may be bonded to each other.

In addition, in the bit line bonding area BLBA, an upper metal pattern 252 may be formed on the uppermost metal layer of the peripheral circuit region PERI, and an upper metal pattern 392 having the same shape as the upper metal pattern 252 may be formed on the uppermost metal layer of the first cell region CELL1. The upper metal pattern 392 of the first cell region CELL1 and the upper metal pattern 252 of the peripheral circuit region PERI may be electrically bonded to each other. In the bit line bonding area BLBA, the bit line 360*c* may be electrically connected to a page buffer included in the peripheral circuit region PERI. For example, some of the circuit elements 220*c* of the peripheral circuit region PERI may provide a page buffer, and the bit line 360*c* may be electrically connected to the circuit elements 220*c* providing the page buffer through an upper bonding metal 370*c* of the first cell region CELL1 and an upper bonding metal 270*c* of the peripheral circuit region PERI.

Referring to FIG. 16, in the word line bonding area WLBA, the word lines 330 of the first cell region CELL1 may extend in the second direction (X direction) parallel to the upper surface of the second substrate 310 and may be connected to cell contact plugs 341 to 347 (340). A first metal line 350*b* and a second metal line 360*b* may be sequentially connected to the upper portions of the cell contact plugs 340 connected to the word lines 330. The cell contact plugs 340 may be connected to the peripheral circuit region PERI through upper bonding metals 371*b* and 370*b* of the cell region CELL1 and upper bonding metals 271*b* and 270*b* of the peripheral circuit region PERI in the word line bonding area WLBA.

The cell contact plugs 340 may be electrically connected to a row decoder included in the peripheral circuit region PERI. For example, some of the circuit elements 220*b* of the peripheral circuit region PERI may provide a row decoder, and the cell contact plugs 340 may be electrically connected to the circuit elements 220*b* providing the row decoder through the upper bonding metal 370*b* of the first cell region CELL1 and the upper bonding metal 270*b* of the peripheral circuit region PERI. In an example embodiment, operating voltages of the circuit elements 220b providing the row decoder may be different than operating voltages of the circuit elements 220c providing the page buffer. For example, the operating voltages of the circuit elements 220c providing the page buffer may be greater than the operating voltages of the circuit elements 220b providing the row decoder.

Similarly, in the word line bonding area WLBA, the word lines 430 of the second cell region CELL2 may extend in the second direction (X direction) parallel to the upper surface of the third substrate 410 and may be connected to cell contact plugs 441 to 447 (440). The cell contact plugs 440 may be connected to the peripheral circuit region PERI through an upper metal pattern of the second cell region CELL2, lower and upper metal patterns of the first cell region CELL1, and a cell contact plug 348.

In the word line bonding area WLBA, the upper bonding metal 370b may be formed in the first cell region CELL1, and the upper bonding metal 270b may be formed in the peripheral circuit region PERI. The upper bonding metal 370b of the first cell region CELL1 and the upper bonding metal 270b of the peripheral circuit region PERI may be electrically bonded to each other. The upper bonding metal 370b and the upper bonding metal 270b may each include aluminum, copper, tungsten, or the like.

In the external pad bonding area PA, a lower metal pattern 371e may be formed at a lower portion of the first cell region CELL1, and an upper metal pattern 472a may be formed at an upper portion of the second cell region CELL2. The lower metal pattern 371e of the first cell region CELL1 and the upper metal pattern 472a of the second cell region CELL2 may be bonded to each other in the external pad bonding area PA. Similarly, an upper metal pattern 372a may be formed at an upper portion of the first cell region CELL1, and an upper metal pattern 272a may be formed at an upper portion of the peripheral circuit region PERI. The upper metal pattern 372a of the first cell region CELL1 and the upper metal pattern 272a of the peripheral circuit region PERI may be bonded to each other.

Common source line contact plugs 380 and 480 may be arranged in the external pad bonding area PA. The common source line contact plugs 380 and 480 may each include a conductive material, such as metals, metal compounds, or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 205, 405, and 406 may be arranged in the external pad bonding area PA. Referring to FIG. 16, a lower insulating layer 201 may cover the lower surface of the first substrate 210, and the first input/output pad 205 may be formed on the lower insulating layer 201. The first input/output pad 205 may be connected through a first input/output contact plug 203 to at least one of the circuit elements 220a arranged in the peripheral circuit region PERI, and may be separated from the first substrate 210 by the lower insulating layer 201. In addition, a side insulating layer may be arranged between the first input/output contact plug 203 and the first substrate 210 and may electrically separate the first input/output contact plug 203 from the first substrate 210.

An upper insulating layer 401 covering the upper surface of the third substrate 410 may be formed on the third substrate 410. The second input/output pad 405 and/or the third input/output pad 406 may be arranged on the upper insulating layer 401. The second input/output pad 405 may be connected through second input/output contact plugs 403 and 303 to at least one of the circuit elements 220a arranged in the peripheral circuit region PERI, and the third input/output pad 406 may be connected through third input/output contact plugs 404 and 304 to at least one of the circuit elements 220a arranged in the peripheral circuit region PERI.

In an example embodiment, the third substrate 410 may not be provided in the area in which the input/output contact plugs are arranged. For example, as illustrated in B, the third input/output contact plug 404 may be separated from the third substrate 410 in a direction parallel to the upper surface of the third substrate 410, and may be connected to the third input/output pad 406 through the interlayer insulating layer 415 of the second cell region CELL2. In this case, the third input/output contact plug 404 may be formed by various processes.

For example, as illustrated in B1, the third input/output contact plug 404 may extend in the third direction (Z direction), and the diameter of the third input/output contact plug 404 may be formed to increase toward the upper insulating layer 401. That is, while the diameter of the channel structure CH described in A1 is formed to decrease toward the upper insulating layer 401, the diameter of the third input/output contact plug 404 may be formed to increase toward the upper insulating layer 401. For example, the third input/output contact plug 404 may be formed after the second cell region CELL2 and the first cell region CELL1 are bonded together.

In addition, for example, as illustrated in B2, the third input/output contact plug 404 may extend in the third direction (Z direction), and the diameter of the third input/output contact plug 404 may be formed to decrease toward the upper insulating layer 401. That is, like the channel structure CH, the diameter of the third input/output contact plug 404 may be formed to decrease toward the upper insulating layer 401. For example, the third input/output contact plug 404 may be formed together with the cell contact plugs 440 before the second cell region CELL2 and the first cell are CELL1 are bonded together.

In another example embodiment, the input/output contact plugs may be disposed to overlap the third substrate 410. For example, as illustrated in C, the second input/output contact plug 403 may be formed by passing through the interlayer insulating layer 415 of the second cell region CELL2 in the third direction (Z direction), and may be electrically connected to the second input/output pad 405 through the third substrate 410. In this case, the connection structure between the second input/output contact plug 403 and the second input/output pad 405 may be implemented in various ways.

For example, as illustrated in C1, an opening 408 passing through the third substrate 410 may be formed, and the second input/output contact plug 403 may be directly connected to the second input/output pad 405 through the opening 408 formed in the third substrate 410. In this case, as illustrated in C1, the diameter of the second input/output contact plug 403 may be formed to increase toward the second input/output pad 405. However, this is only an example, and the diameter of the second input/output contact plug 403 may be formed to decrease toward the second input/output pad 405.

For example, as illustrated in C2, the opening 408 passing through the third substrate 410 may be formed, and a contact 407 may be formed in the opening 408. One end portion of the contact 407 may be connected to the second input/output pad 405, and the other end portion of the contact 407 may be connected to the second input/output contact plug 403. Accordingly, the second input/output contact plug 403 may be electrically connected to the second input/output pad 405 through the contact 407 in the opening 408. In this case, as illustrated in C2, the diameter of the contact 407 may be formed to increase toward the second input/output pad 405, and the diameter of the second input/output contact plug 403 may be formed to decrease toward the second input/output pad 405. For example, the second input/output contact plug 403 may be formed together with the cell contact plugs 440 before the second cell region CELL2 is bonded to the first cell region CELL1, and the contact 407 may be formed after the second cell region CELL2 is bonded to the first cell region CELL1.

In addition, for example, as illustrated in C3, a stopper 409 may be further formed on the upper surface of the opening 408 of the third substrate 410, as compared to C2. The stopper 409 may be a metal line formed on the same layer as the common source line 420. However, this is only an example, and the stopper 409 may be a metal line formed on the same layer as at least one of the word lines 430. The second input/output contact plug 403 may be electrically connected to the second input/output pad 405 through the contact 407 and the stopper 409.

On the other hand, similar to the second and third input/output contact plugs 403 and 404 of the second cell region CELL2, the diameters of the second and third input/output contact plugs 303 and 304 of the first cell region CELL1 may each be formed to decrease toward the lower metal pattern 371e or to increase toward the lower metal pattern 371e.

On the other hand, according to example embodiments, a slit 411 may be formed in the third substrate 410. For example, the slit 411 may be formed at an arbitrary position of the external pad bonding area PA. For example, as illustrated in D, the slit 411 may be located between the second input/output pad 405 and the cell contact plugs 440 when viewed from a plan view. However, this is only an example, and the slit 411 may be formed so that the second input/output pad 405 is located between the slit 411 and the cell contact plugs 440 when viewed from a plan view.

For example, as illustrated in D1, the slit 411 may be formed to pass through the third substrate 410. For example, the slit 411 may be used to prevent the third substrate 410 from being slightly cracked when the opening 408 is formed. However, this is only an example, and the slit 411 may be formed to a depth of about 60% to about 70% of the thickness of the third substrate 410.

In addition, for example, as illustrated in D2, a conductive material 412 may be formed in the slit 411. For example, the conductive material 412 may be used to discharge, to the outside, a leakage current generated during driving of the circuit elements in the external pad bonding area PA. In this case, the conductive material 412 may be connected to an external ground line.

In addition, for example, as illustrated in D3, an insulating material 413 may be formed in the slit 411. For example, the insulating material 413 may be formed in order to electrically separate the second input/output pad 405 and the second input/output contact plug 403 in the external pad bonding area PA from the word line bonding area WLBA. The insulating material 413 formed in the slit 411 may prevent a voltage provided through the second input/output pad 405 from affecting the metal layer disposed on the third substrate 410 in the word line bonding area WLBA.

On the other hand, according to example embodiments, the first to third input/output pads 205, 405, and 406 may be optionally formed. For example, the memory device 500 may be implemented to include only the first input/output pad 205 disposed on the first substrate 210, to include only the second input/output pad 405 disposed on the third substrate 410, or to include only the third input/output pad 406 disposed on the upper insulating layer 401.

On the other hand, according to example embodiments, at least one of the second substrate 310 of the first cell region CELL1 and the third substrate 410 of the second cell region CELL2 may be used as a sacrificial substrate and may be completely or partially removed before or after the bonding process. An additional layer may be stacked after substrate removal. For example, the second substrate 310 of the first cell region CELL1 may be removed before or after the peripheral circuit region PERI is bonded to the first cell region CELL1, and an insulating layer covering the upper surface of the common source line 320 or a conductive layer for connection may be formed. Similarly, the third substrate 410 of the second cell region CELL2 may be removed before or after the first cell region CELL1 is bonded to the second cell region CELL2, and an upper insulating layer 401 covering the upper surface of the common source line 420 or a conductive layer for connection may be formed.

While aspect of example embodiments have been particularly shown and described, it will be understood that various changes in form and details may be made therein without departing from the spirit and scope of the following claims.

What is claimed is:

1. A memory device comprising:
   a first cell region provided in a first physical layer among a plurality of stacked physical layers of the memory device, the first cell region comprising a first bit line and a first redundant bit line;
   a second cell region provided in a second physical layer among the plurality of stacked physical layers, the second cell region comprising a second bit line and a second redundant bit line;
   a peripheral region provided in a third physical layer among the plurality of stacked physical layers, the peripheral region comprising a plurality of first page buffers configured to be respectively connected to the first bit line and the second bit line, and a second page buffer configured to be commonly connected to the first redundant bit line and the second redundant bit line; and
   a control circuit configured to:
      based on the first bit line being identified as defective, replace the first bit line with the first redundant bit line; and
      based on the second bit line being identified as defective, replace the second bit line with the second redundant bit line,
   wherein the first redundant bit line and the second redundant bit line share the second page buffer.

2. The memory device of claim 1, wherein the first cell region and the second cell region are connected to each other through a first bonding pad, and wherein the second cell region and the peripheral region are connected to each other through a second bonding pad.

3. The memory device of claim 1, further comprising a single pass transistor provided in the peripheral region, wherein the first cell region comprises a first word line, wherein the second cell region comprises a second word line, and wherein the first word line and the second word line are connected to the single pass transistor through a common line.

4. The memory device of claim 3, further comprising:

a first string select line provided in the first cell region and connected to the first word line; and a second string select line that is different from the first string select line, provided in the second cell region and connected to the second word line.

5. The memory device of claim 1, wherein the first cell region is associated with a first address, wherein the second cell region is associated with a second address, and wherein the first page buffer is configured to distinguish between the first bit line and the second bit line based on whether an address indicates the first address or the second address.

6. The memory device of claim 1, wherein the control circuit is further configured to, based on the first bit line being opened, replace the first bit line with the first redundant bit line.

7. The memory device of claim 1, wherein the control circuit is further configured to, based on the second bit line being opened, replace the second bit line with the second redundant bit line.

8. The memory device of claim 1, wherein the control circuit is further configured to, based on a short being detected between the second bit line and another bit line adjacent to the second bit line, replace the second bit line with the first redundant bit line of the second cell region, and replace the other bit line in which the short occurs with a third redundant bit line connected to the second page buffer that is different from the first page buffer.

* * * * *